(12) United States Patent  
Forbes et al.

(10) Patent No.: US 7,545,674 B2  
(45) Date of Patent: Jun. 9, 2009

(54) FLASH MEMORY WITH LOW TUNNEL BARRIER INTERPOLY INSULATORS

(75) Inventors: Leonard Forbes, Corvallis, OR (US); Jerome M. Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 244 days.

(21) Appl. No.: 10/931,704

(22) Filed: Sep. 1, 2004

(65) Prior Publication Data

US 2005/0026349 A1    Feb. 3, 2005

Related U.S. Application Data

(62) Division of application No. 09/945,507, filed on Aug. 30, 2001, now Pat. No. 7,068,544.

(51) Int. Cl.  
*G11C 11/34* (2006.01)

(52) U.S. Cl. .................... 365/185.05; 365/189.09; 257/314; 257/315

(58) Field of Classification Search ............ 365/185.05, 365/189.09; 257/314, 315  
See application file for complete search history.

(56) References Cited

U.S. PATENT DOCUMENTS

| | | | |
|---|---|---|---|
| 3,978,577 A | 9/1976 | Bhattacharyya et al. ........ 29/571 |
| 4,295,150 A | 10/1981 | Adam .......................... 357/54 |
| 4,412,902 A | 11/1983 | Michikami et al. .......... 204/192 |
| 4,449,205 A | 5/1984 | Hoffman ..................... 365/182 |
| 4,495,219 A | 1/1985 | Kato et al. ................... 427/82 |
| 4,510,584 A | 4/1985 | Dias et al. |
| 4,545,035 A | 10/1985 | Guterman et al. |
| 4,556,975 A | 12/1985 | Smith et al. |
| 4,645,622 A | 2/1987 | Kock |
| 4,665,417 A | 5/1987 | Lam |
| 4,672,240 A | 6/1987 | Smith et al. |
| 4,688,078 A | 8/1987 | Hseih ......................... 257/321 |
| 4,717,943 A | 1/1988 | Wolf et al. ................. 357/23.5 |
| 4,757,360 A | 7/1988 | Faraone ..................... 357/23.5 |

(Continued)

OTHER PUBLICATIONS

Pollack, S., et al., "Tunneling Through Gaseous Oxidized Films of Al2O3", *Transactions of the Metallurgical Society of AIME*, 233, (1965),497-501.

(Continued)

*Primary Examiner*—Son Dinh  
(74) *Attorney, Agent, or Firm*—Schwegman, Lundberg & Woessner, P.A.

(57) ABSTRACT

Structures and methods for Flash memory with low tunnel barrier intergate insulators are provided. The non-volatile memory includes a first source/drain region and a second source/drain region separated by a channel region in a substrate. A floating gate opposing the channel region and is separated therefrom by a gate oxide. A control gate opposes the floating gate. The control gate is separated from the floating gate by a low tunnel barrier intergate insulator. The low tunnel barrier intergate insulator includes a metal oxide insulator selected from the group consisting of PbO, $Al_2O_3$, $Ta_2O_5$, $TiO_2$, $ZrO_2$, and $Nb_2O_5$. The floating gate includes a polysilicon floating gate having a metal layer formed thereon in contact with the low tunnel barrier intergate insulator. And, the control gate includes a polysilicon control gate having a metal layer formed thereon in contact with the low tunnel barrier intergate insulator.

38 Claims, 15 Drawing Sheets

U.S. PATENT DOCUMENTS

| | | | | |
|---|---|---|---|---|
| 4,780,424 A | 10/1988 | Holler | | 437/29 |
| 4,794,565 A | 12/1988 | Wu et al. | | 365/185 |
| 4,870,470 A | 9/1989 | Bass, Jr. et al. | | 357/23.5 |
| 4,939,559 A | 7/1990 | DiMaria et al. | | 257/38 |
| 5,042,011 A | 8/1991 | Casper et al. | | 365/205 |
| 5,057,448 A | 10/1991 | Kuroda | | |
| 5,071,782 A | 12/1991 | Mori | | 437/48 |
| 5,073,519 A | 12/1991 | Rodder | | 438/269 |
| 5,153,880 A | 10/1992 | Owen et al. | | |
| 5,280,205 A | 1/1994 | Green et al. | | 307/530 |
| 5,315,142 A | 5/1994 | Acovic et al. | | |
| 5,331,188 A | 7/1994 | Acovic et al. | | |
| 5,338,953 A | 8/1994 | Wake | | |
| 5,353,431 A | 10/1994 | Doyle et al. | | |
| 5,399,516 A | 3/1995 | Bergendahl et al. | | 437/43 |
| 5,418,389 A | 5/1995 | Watanabe | | 257/295 |
| 5,445,984 A | 8/1995 | Hong et al. | | 437/43 |
| 5,455,792 A | 10/1995 | Yi | | 365/185.12 |
| 5,474,947 A | 12/1995 | Chang et al. | | |
| 5,488,612 A | 1/1996 | Heybruck | | 714/725 |
| 5,497,494 A | 3/1996 | Combs et al. | | 395/750 |
| 5,498,558 A | 3/1996 | Kapoor | | 437/43 |
| 5,508,544 A | 4/1996 | Shah | | 257/316 |
| 5,510,278 A | 4/1996 | Nguyen et al. | | 437/40 |
| 5,576,567 A | 11/1996 | Mori | | |
| 5,600,592 A | 2/1997 | Atsumi et al. | | 365/185.18 |
| 5,608,670 A * | 3/1997 | Akaogi et al. | | 365/185.23 |
| 5,617,351 A | 4/1997 | Bertin et al. | | 365/185.05 |
| 5,618,575 A | 4/1997 | Peter | | 427/8 |
| 5,618,761 A | 4/1997 | Eguchi et al. | | |
| 5,619,051 A | 4/1997 | Endo | | |
| 5,619,450 A * | 4/1997 | Takeguchi | | 365/185.23 |
| 5,619,642 A | 4/1997 | Nielsen et al. | | 395/182.04 |
| 5,627,785 A | 5/1997 | Gilliam et al. | | 365/189.01 |
| 5,646,430 A | 7/1997 | Kaya et al. | | 257/322 |
| 5,677,867 A | 10/1997 | Hazani | | 365/185 |
| 5,691,209 A | 11/1997 | Liberkowski | | 437/7 |
| 5,691,230 A | 11/1997 | Forbes | | 437/62 |
| 5,703,387 A | 12/1997 | Hong | | |
| 5,705,415 A | 1/1998 | Orlowski et al. | | |
| 5,712,180 A * | 1/1998 | Guterman et al. | | 438/263 |
| 5,739,544 A | 4/1998 | Yuki et al. | | 257/25 |
| 5,739,567 A | 4/1998 | Wong | | |
| 5,751,038 A | 5/1998 | Mukherjee | | |
| 5,768,192 A | 6/1998 | Eitan | | |
| 5,798,548 A | 8/1998 | Fujiwara | | |
| 5,801,401 A | 9/1998 | Forbes | | 257/77 |
| 5,808,943 A | 9/1998 | Sato et al. | | |
| 5,852,306 A | 12/1998 | Forbes | | 257/315 |
| 5,910,916 A * | 6/1999 | Akaogi et al. | | 365/185.29 |
| 5,923,056 A | 7/1999 | Lee et al. | | 257/192 |
| 5,936,274 A | 8/1999 | Forbes et al. | | 257/315 |
| 5,952,692 A | 9/1999 | Nakazato et al. | | 257/321 |
| 5,959,465 A | 9/1999 | Beat | | 326/39 |
| 5,969,383 A | 10/1999 | Chang et al. | | |
| 5,981,350 A | 11/1999 | Geusic et al. | | 438/386 |
| 5,986,932 A | 11/1999 | Ratnakumar et al. | | 365/185.07 |
| 5,991,225 A | 11/1999 | Forbes et al. | | 365/230.06 |
| 6,009,011 A | 12/1999 | Yamauchi | | |
| 6,025,225 A | 2/2000 | Forbes et al. | | |
| 6,025,228 A | 2/2000 | Ibok et al. | | 438/261 |
| 6,025,627 A | 2/2000 | Forbes et al. | | 257/321 |
| 6,031,263 A | 2/2000 | Forbes et al. | | 257/315 |
| 6,069,380 A | 5/2000 | Chou et al. | | 257/315 |
| 6,069,816 A | 5/2000 | Nishimura | | 365/145 |
| 6,077,745 A | 6/2000 | Burns, Jr. et al. | | 438/270 |
| 6,087,222 A | 7/2000 | Jung Lin et al. | | |
| 6,087,695 A * | 7/2000 | Chen | | 257/314 |
| 6,090,636 A | 7/2000 | Geusic et al. | | |
| 6,091,626 A | 7/2000 | Madan | | |
| 6,093,606 A | 7/2000 | Lin et al. | | |
| 6,101,131 A | 8/2000 | Chang | | 365/185.33 |
| 6,118,147 A | 9/2000 | Liu | | |
| 6,124,608 A | 9/2000 | Liu et al. | | |
| 6,124,729 A | 9/2000 | Noble et al. | | 326/41 |
| 6,127,227 A | 10/2000 | Lin et al. | | 438/261 |
| 6,130,453 A | 10/2000 | Mei et al. | | |
| 6,134,175 A | 10/2000 | Forbes et al. | | 365/230.06 |
| 6,135,175 A | 10/2000 | Gaudreault et al. | | 144/4.1 |
| 6,141,238 A | 10/2000 | Forbes et al. | | 365/145 |
| 6,141,248 A | 10/2000 | Forbes et al. | | 365/185.08 |
| 6,143,636 A | 11/2000 | Forbes et al. | | 438/587 |
| 6,144,584 A * | 11/2000 | Kunori et al. | | 365/185.18 |
| 6,147,378 A | 11/2000 | Liu et al. | | |
| 6,150,188 A | 11/2000 | Geusic et al. | | |
| 6,153,468 A | 11/2000 | Forbes et al. | | 438/257 |
| 6,157,061 A | 12/2000 | Kawata | | |
| 6,163,049 A | 12/2000 | Bui | | 257/321 |
| 6,169,306 B1 | 1/2001 | Gardner et al. | | 257/310 |
| 6,172,397 B1 | 1/2001 | Oonakado et al. | | |
| 6,180,461 B1 | 1/2001 | Ogura | | |
| 6,180,980 B1 | 1/2001 | Wang | | |
| 6,191,448 B1 | 2/2001 | Forbes et al. | | |
| 6,191,459 B1 | 2/2001 | Hofmann et al. | | |
| 6,198,168 B1 | 3/2001 | Geusic et al. | | |
| 6,204,529 B1 | 3/2001 | Lung et al. | | |
| 6,208,164 B1 | 3/2001 | Noble et al. | | 326/41 |
| 6,210,999 B1 | 4/2001 | Gardner et al. | | 438/183 |
| 6,229,175 B1 | 5/2001 | Uchida | | 257/315 |
| 6,238,976 B1 | 5/2001 | Noble et al. | | 438/259 |
| 6,246,606 B1 | 6/2001 | Forbes et al. | | 365/185.03 |
| 6,249,020 B1 | 6/2001 | Forbes et al. | | 257/315 |
| 6,249,460 B1 | 6/2001 | Forbes et al. | | 365/185.28 |
| 6,288,419 B1 | 9/2001 | Prall et al. | | 257/213 |
| 6,306,708 B1 | 10/2001 | Peng | | 438/266 |
| 6,316,298 B1 | 11/2001 | Lee | | |
| 6,317,357 B1 | 11/2001 | Forbes | | |
| 6,317,364 B1 | 11/2001 | Guterman et al. | | |
| 6,323,844 B1 | 11/2001 | Yeh et al. | | 345/166 |
| 6,335,554 B1 | 1/2002 | Yoshikawa | | |
| 6,341,084 B2 | 1/2002 | Numata et al. | | |
| 6,377,070 B1 | 4/2002 | Forbes | | 326/41 |
| 6,381,168 B2 | 4/2002 | Forbes | | |
| 6,399,979 B1 | 6/2002 | Noble et al. | | |
| 6,418,050 B2 | 7/2002 | Forbes | | |
| 6,424,001 B1 | 7/2002 | Forbes et al. | | 257/315 |
| 6,429,065 B2 | 8/2002 | Forbes | | |
| 6,433,382 B1 | 8/2002 | Orlowski et al. | | 257/315 |
| 6,433,383 B1 | 8/2002 | Ramsbey et al. | | |
| 6,434,041 B2 | 8/2002 | Forbes et al. | | |
| 6,440,801 B1 | 8/2002 | Furukawa et al. | | |
| 6,441,417 B1 | 8/2002 | Zhang et al. | | |
| 6,444,592 B1 | 9/2002 | Ballantine et al. | | |
| 6,452,229 B1 | 9/2002 | Krivokapic | | |
| 6,454,912 B1 | 9/2002 | Ahn et al. | | |
| 6,461,905 B1 | 10/2002 | Wang et al. | | |
| 6,461,931 B1 | 10/2002 | Eldridge | | 438/398 |
| 6,465,298 B2 | 10/2002 | Forbes et al. | | |
| 6,465,836 B2 | 10/2002 | Lin et al. | | |
| 6,475,857 B1 | 11/2002 | Kim et al. | | 438/240 |
| 6,476,434 B1 | 11/2002 | Noble et al. | | |
| 6,486,027 B1 | 11/2002 | Noble et al. | | |
| 6,486,703 B2 | 11/2002 | Noble et al. | | |
| 6,492,233 B2 | 12/2002 | Forbes et al. | | |
| 6,495,436 B2 | 12/2002 | Ahn et al. | | |
| 6,498,065 B1 | 12/2002 | Forbes et al. | | |
| 6,504,207 B1 | 1/2003 | Chen et al. | | |
| 6,504,214 B1 | 1/2003 | Yu et al. | | |
| 6,514,828 B2 | 2/2003 | Ahn et al. | | |
| 6,514,842 B1 | 2/2003 | Prall et al. | | 438/593 |
| 6,515,510 B2 | 2/2003 | Noble et al. | | |
| 6,518,615 B1 | 2/2003 | Geusic et al. | | |
| 6,519,176 B1 | 2/2003 | Hamzaoglu et al. | | |
| 6,526,191 B1 | 2/2003 | Geusic et al. | | |

| | | | | | |
|---|---|---|---|---|---|
| 6,534,420 B2 | 3/2003 | Ahn et al. | 2001/0041250 A1 | 11/2001 | Werkhoven et al. |
| 6,538,330 B1 | 3/2003 | Forbes | 2001/0055838 A1 | 12/2001 | Walker et al. ............... 438/129 |
| 6,541,280 B2 | 4/2003 | Kaushik et al. ................ 438/3 | 2002/0001971 A1 | 1/2002 | Cho |
| 6,542,229 B1 | 4/2003 | Kalal et al. | 2002/0008324 A1 | 1/2002 | Shinkawata |
| 6,566,682 B2 | 5/2003 | Forbes | 2002/0024083 A1 | 2/2002 | Noble et al. |
| 6,574,143 B2 | 6/2003 | Nakazato | 2002/0028541 A1 | 3/2002 | Lee et al. .................... 438/149 |
| 6,597,037 B1 | 7/2003 | Forbes et al. | 2002/0106536 A1 | 8/2002 | Lee et al. .................... 428/702 |
| 6,630,383 B1 | 10/2003 | Ibok et al. | 2002/0109158 A1 | 8/2002 | Forbes et al. |
| 6,674,138 B1 | 1/2004 | Halliyal et al. | 2002/0137250 A1 | 9/2002 | Nguyen et al. ................ 438/53 |
| 6,689,660 B1 | 2/2004 | Noble et al. | 2002/0140022 A1 | 10/2002 | Lin et al. |
| 6,709,978 B2 | 3/2004 | Geusic et al. | 2002/0142536 A1 | 10/2002 | Zhang et al. |
| 6,723,577 B1 | 4/2004 | Geusic et al. | 2002/0175326 A1 | 11/2002 | Reed et al. |
| 6,730,575 B2 | 5/2004 | Eldridge ..................... 257/310 | 2002/0176293 A1 | 11/2002 | Forbes et al. |
| 6,740,928 B2 | 5/2004 | Yoshii et al. | 2002/0192974 A1 | 12/2002 | Ahn et al. |
| 6,746,930 B2 | 6/2004 | Yang et al. | 2003/0042527 A1 | 3/2003 | Forbes et al. ................ 257/315 |
| 6,753,571 B2 | 6/2004 | Kim et al. | 2003/0042528 A1 | 3/2003 | Forbes |
| 6,754,108 B2 | 6/2004 | Forbes | 2003/0042532 A1 | 3/2003 | Forbes ........................ 257/316 |
| 6,756,298 B2 | 6/2004 | Ahn et al. | 2003/0043622 A1 | 3/2003 | Forbes .................... 365/185.05 |
| 6,764,901 B2 | 7/2004 | Noble | 2003/0043630 A1 | 3/2003 | Forbes et al. ........... 365/185.26 |
| 6,767,795 B2 | 7/2004 | Ahn et al. | 2003/0043633 A1 | 3/2003 | Forbes et al. ........... 365/185.28 |
| 6,770,923 B2 | 8/2004 | Nguyen et al. | 2003/0043637 A1 | 3/2003 | Forbes et al. |
| 6,777,715 B1 | 8/2004 | Geusic et al. | 2003/0045078 A1 | 3/2003 | Ahn et al. |
| 6,778,441 B2 | 8/2004 | Forbes et al. | 2003/0045082 A1 | 3/2003 | Eldridge et al. ............. 438/593 |
| 6,787,370 B2 | 9/2004 | Forbes | 2003/0048666 A1 | 3/2003 | Eldridge et al. ......... 365/185.28 |
| 6,790,791 B2 | 9/2004 | Ahn et al. | 2003/0119246 A1 | 6/2003 | Ahn |
| 6,794,250 B2 | 9/2004 | Chang et al. | 2003/0134475 A1 | 7/2003 | Hofmann et al. |
| 6,800,895 B2 | 10/2004 | Chang et al. | 2003/0207032 A1 | 11/2003 | Ahn et al. |
| 6,804,136 B2 | 10/2004 | Forbes | 2003/0207540 A1 | 11/2003 | Ahn et al. |
| 6,812,100 B2 | 11/2004 | Ahn et al. | 2003/0227033 A1 | 12/2003 | Ahn et al. |
| 6,812,513 B2 | 11/2004 | Geusic et al. | 2003/0228747 A1 | 12/2003 | Ahn et al. |
| 6,812,516 B2 | 11/2004 | Noble, Jr. et al. | 2004/0004245 A1 | 1/2004 | Forbes et al. ................ 257/315 |
| 6,818,937 B2 | 11/2004 | Noble et al. | 2004/0004247 A1 | 1/2004 | Forbes et al. ................ 257/324 |
| 6,844,203 B2 | 1/2005 | Ahn et al. | 2004/0004859 A1 | 1/2004 | Forbes et al. ........... 365/185.05 |
| 6,852,645 B2 | 2/2005 | Colombo et al. | 2004/0023461 A1 | 2/2004 | Ahn et al. |
| 6,858,120 B2 | 2/2005 | Ahn et al. | 2004/0032773 A1 | 2/2004 | Forbes |
| 6,858,444 B2 | 2/2005 | Ahn et al. | 2004/0038554 A1 | 2/2004 | Ahn |
| 6,884,739 B2 | 4/2005 | Ahn et al. | 2004/0040494 A1 | 3/2004 | Vaartstra et al. |
| 6,888,739 B2 | 5/2005 | Forbes | 2004/0043541 A1 | 3/2004 | Ahn |
| 6,893,984 B2 | 5/2005 | Ahn et al. | 2004/0075111 A1 | 4/2004 | Chidambarrao et al. |
| 6,894,944 B2 | 5/2005 | Ishibashi et al. | 2004/0110348 A1 | 6/2004 | Ahn et al. |
| 6,900,122 B2 | 5/2005 | Ahn et al. | 2004/0110391 A1 | 6/2004 | Ahn et al. |
| 6,903,367 B2 | 6/2005 | Forbes | 2004/0144980 A1 | 7/2004 | Ahn et al. |
| 6,914,800 B2 | 7/2005 | Ahn et al. | 2004/0156578 A1 | 8/2004 | Geusic et al. |
| 6,919,266 B2 | 7/2005 | Ahn et al. | 2004/0159863 A1 | 8/2004 | Eldridge et al. |
| 6,921,702 B2 | 7/2005 | Ahn et al. | 2004/0160830 A1 | 8/2004 | Forbes |
| 6,950,340 B2 | 9/2005 | Bhattacharyya | 2004/0175882 A1 | 9/2004 | Ahn et al. |
| 6,952,032 B2 | 10/2005 | Forbes et al. | 2004/0214399 A1 | 10/2004 | Ahn et al. |
| 6,963,103 B2 | 11/2005 | Forbes | 2004/0219783 A1 | 11/2004 | Ahn et al. |
| 6,995,437 B1 | 2/2006 | Kinoshita et al. | 2004/0233010 A1 | 11/2004 | Akram et al. |
| 7,018,868 B1 | 3/2006 | Yang et al. | 2004/0262700 A1 | 12/2004 | Ahn et al. |
| 7,042,043 B2 | 5/2006 | Forbes et al. | 2005/0012141 A1 | 1/2005 | Bhattacharyya |
| 7,049,192 B2 | 5/2006 | Ahn et al. | 2005/0020017 A1 | 1/2005 | Ahn et al. |
| 7,068,544 B2 | 6/2006 | Forbes et al. | 2005/0023574 A1 | 2/2005 | Forbes et al. |
| 7,072,223 B2 | 7/2006 | Bhattacharyya | 2005/0023595 A1 | 2/2005 | Forbes et al. |
| 7,074,673 B2 | 7/2006 | Leonard | 2005/0023602 A1 | 2/2005 | Forbes et al. |
| 7,075,829 B2 | 7/2006 | Forbes | 2005/0023603 A1 | 2/2005 | Eldridge et al. |
| 7,087,954 B2 | 8/2006 | Forbes | 2005/0024092 A1 | 2/2005 | Forbes |
| 7,126,183 B2 * | 10/2006 | Forbes et al. ................ 257/314 | 2005/0024945 A1 | 2/2005 | Forbes |
| 7,135,734 B2 | 11/2006 | Eldridge et al. | 2005/0026360 A1 | 2/2005 | Geusic et al. |
| 7,153,744 B2 | 12/2006 | Chen et al. | 2005/0030825 A1 | 2/2005 | Ahn |
| 7,154,138 B2 | 12/2006 | Hofmann et al. | 2005/0032342 A1 | 2/2005 | Forbes et al. |
| 7,163,863 B2 | 1/2007 | Shone | 2005/0054165 A1 | 3/2005 | Ahn et al. |
| 7,187,587 B2 | 3/2007 | Forbes | 2005/0138262 A1 | 6/2005 | Forbes |
| 7,205,601 B2 | 4/2007 | Lee et al. | 2005/0140462 A1 | 6/2005 | Akram et al. |
| 7,274,067 B2 | 9/2007 | Forbes | 2005/0164521 A1 | 7/2005 | Ahn et al. |
| 7,323,423 B2 | 1/2008 | Brask et al. | 2005/0169054 A1 | 8/2005 | Forbes |
| 7,365,027 B2 | 4/2008 | Ahn et al. | 2005/0249024 A1 | 11/2005 | Bhattacharyya |
| 7,372,096 B2 | 5/2008 | Forbes et al. | 2006/0001049 A1 | 1/2006 | Forbes |
| 7,372,097 B2 | 5/2008 | Forbes et al. | 2006/0170029 A1 | 8/2006 | Liu et al. |
| 7,374,964 B2 | 5/2008 | Ahn et al. | 2006/0176645 A1 | 8/2006 | Ahn et al. |
| 7,391,072 B2 | 6/2008 | Forbes et al. | 2006/0177975 A1 | 8/2006 | Ahn et al. |
| 7,410,910 B2 | 8/2008 | Ahn et al. | 2006/0183272 A1 | 8/2006 | Ahn et al. |
| 2001/0013621 A1 | 8/2001 | Nakazato ..................... 257/314 | 2006/0186458 A1 | 8/2006 | Forbes et al. |

| | | | |
|---|---|---|---|
| 2006/0189154 A1 | 8/2006 | Ahn et al. |
| 2006/0199338 A1 | 9/2006 | Eldridge et al. |
| 2006/0223337 A1 | 10/2006 | Ahn et al. |
| 2006/0263981 A1 | 11/2006 | Forbes |
| 2006/0274580 A1 | 12/2006 | Forbes |
| 2007/0018214 A1 | 1/2007 | Ahn |
| 2007/0020835 A1 | 1/2007 | Ahn et al. |
| 2007/0049051 A1 | 3/2007 | Ahn et al. |
| 2007/0049054 A1 | 3/2007 | Ahn et al. |
| 2007/0090440 A1 | 4/2007 | Ahn et al. |
| 2007/0105313 A1 | 5/2007 | Forbes |
| 2007/0138534 A1 | 6/2007 | Eldridge et al. |
| 2007/0145462 A1 | 6/2007 | Eldridge et al. |
| 2007/0158765 A1 | 7/2007 | Ahn et al. |
| 2007/0170492 A1 | 7/2007 | Forbes et al. |
| 2007/0195608 A1 | 8/2007 | Forbes et al. |
| 2008/0029790 A1 | 2/2008 | Ahn et al. |
| 2008/0032424 A1 | 2/2008 | Ahn et al. |
| 2008/0032465 A1 | 2/2008 | Ahn et al. |
| 2008/0048225 A1 | 2/2008 | Ahn et al. |

OTHER PUBLICATIONS

Qi, Wen-Jie, "MOSCAP and MOSFET characteristics using ZrO/sub 2/ gate dielectric deposited directly on Si", *International Electron Devices Meeting 1999. Technical Digest*, (1999),145-148.

Robertson, J., "Band offsets of wide-band-gap oxides and implications for future electronic devices", *Journal of Vacuum Science & Technology B (Microelectronics and Nanometer Structures)*, 18(3), (May-Jun. 2000),1785-1791.

Robertson, J., et al., "Schottky Barrier height of Tantalum oxide, barium strontium titanate, lead titanate, and strontium bismuth tantalate", *Applied Physics Letters*,74(8), (Feb. 22, 1999), 1168-1170.

Robertson, J., "Schottky barrier heights of tantalum oxide, barium strontium-titanate, lead titanate, and strontium bismuth tantalate", *Applied Physics Letters*, 74(8), (Feb. 22, 1999),1168-1170.

Shi, Y., "Tunneling Leakage Current in Ultrathin (<4 nm) Nitride/Oxide Stack Dielectrics", *IEEE Electron Device Letters*, 19(10), (Oct. 1998),pp. 388-390.

Shi, Ying, et al., "Tunneling Leakage Current in Ultrathin (<4 nm) Nitride/Oxide Stack Dielectrics", *IEEE Electron Device Letters*, 19(10), (Oct. 1998),388-390.

Simmons, J., "Generalized Formula for the Electric Tunnel Effect between Similiar Electrodes Separated by a Thin Insulating Film", *Journal of Applied Physics*, 34(6), (1963),1793-1803.

Smith, Ryan C., et al., "Chemical vapour deposition of the oxides of titanium, zirconium and hafnium for use as high-k materials in microelectronic devices. A carbon-free precursor for the synthesis of hafnium dioxide", *Advanced Materials for Optics and Electronics*, 10(3-5), (May-Oct. 2000),105-106.

Swalin, R., "Equilibrium between Phases of Variable Composition", *In: Thermodynamics of solids*, New York, J. Wiley, 2nd Edition,(1972),165-180.

Sze, S., "Physics of Semiconductor Devices, Second Edition", *John Wiley & Sons, New York*, (1981),553-556.

Yamaguchi, Takeshi, "Band Diagram and Carrier Conduction Mechanism in ZrO2/Zr-silicate/Si MIS Structure Fabricated by Pulsed-laser-ablation Deposition", *Electron Devices Meeting, 2000. IEDM Technical Digest. International*, (2000),19-22.

Yan, J., et al., "Structural and electrical characterization of TiO/sub 2/ grown from titanium tetrakis-isopropoxide (TTIP) and TTIP/H/sub 2/O ambients", *Journal of Vacuum Science & Technology B (Microelectronics and Nanometer Structures)*, 14(3), (May-Jun. 1996),1706-1711.

Zhang, H., et al.,"Atomic layer deposition of high dielectric constant nanolaminates", *Journal of The Electrochemical Society*, 148(4), (Apr. 2001),F63-F66.

Aarik, Jaan, et al., "Anomalous effect of temperature on atomic layer deposition of titanium dioxide", *Journal of Crystal Growth*, 220(4), (Dec. 2000),531-537.

Aarik, Jaan, et al., "Texture development in nanocrystalline hafnium dioxide thin films grown by atomic layer deposition", *Journal of Crystal Growth*, 220(1-2), (Nov. 15, 2000), 105-113.

Afanas'ev, V., et al., "Electron energy barriers between (100)Si and ultrathin stacks of SiO2, Al2O3, and ZrO2 insulators", *Applied Physics Letters*, 78(20), (May 14, 2001),3073-3075.

Arya, S. P., et al., "Conduction properties of thin Al/sub 2/O/sub 3/ films", *Thin Solid Films*, 91(4), (May 28, 1982),363-374.

Bhattacharyya, A., "Physical & Electrical Characteristics of LPCVD Silicon Rich Nitride", *ECS Technical Digest, J. Eletrochem. Soc.*, 131(11), 691 RDP, New Orleans,(1984),469C.

Dipert, Brian, "Flash Memory Goes Mainstream", *IEEE Spectrum*, 30(10), (Oct. 1993),48-52.

Eierdal, L., et al., "Interaction of oxygen with Ni(110) studied by scanning tunneling microscopy", *Surface Science*, 312(1-2), (Jun. 1994),31-53.

Eldridge, J. M., et al., "Analysis of ultrathin oxide growth on indium", *Thin Solid Films*, 12(2), (Oct. 1972),447-451.

Eldridge, J. M., et al., "Growth of Thin PbO Layers on Lead Films. I. Experiment", *Surface Science*, 40(3), (Dec. 1973),512-530.

Eldridge, J., et al., "Measurement of Tunnel Current Density in a Metal-Oxide-Metal System as a Function of Oxide Thickness", *Proc. 12th Intern. Conf. on Low Temperature Physics*, (1971),427-428.

Eldridge, J.M., et al., "The Growth of Thin PbO Layers on Lead Films", *Surface Science*, 40, (1973),512-530.

Ferguson, J D., et al., "Atomic layer deposition of Al2O3 and SiO2 on BN particles using sequential surface reactions", *Applied Surface Science*, 162-163, (Aug. 1, 2000),280-292.

Greiner, J., "Josephson Tunneling Barriers by rf Sputter Etching in an Oxygen Plasma", *Journal of Applied Physics*, 42(12), (Nov. 1971),5151-5155.

Greiner, J., "Oxidation of lead films by rf sputter etching in an oxygen plasma", *Journal of Applied Physics*, 45(1), (1974),32-37.

Grimblot, Jean, et al., "I. Interaction of Al films with O2 at low pressures", *Journal of the Electrochemical Society*, 129(10), (1982),2366-2368.

Grimblot, J., et al., "II. Oxidation of Aluminum Films", *Journal of the Electrochemical Society*, 129(10), (1982),2369-2372.

Gundlach, K., et al., "Logarithmic conductivity of Al-Al/sub 2/O/sub 3/-Al tunneling junctions produced by plasma- and by thermal-oxidation", *Surface Science*, 27(1), (Aug. 1971), 125-141.

Guo, X., "High Quality Ultra-thin (1.5 nm) High quality ultra-thin (1.5 nm) TiO/sub 2/-Si/sub 3/N/sub 4/ gate dielectric for deep sub-micron CMOS technology", *International Electron Devices Meeting 1999. Technical Digest*, (1999),137-140.

Han, Kwangseok, "Characteristics of P-Channel Si Nano-Crystal Memory", *IEDM Technical Digest, International Electron Devices Meeting*, (Dec. 10-13, 2000),309-312.

Hodges, D. A., et al., "Analysis and Design of Digital Integrated Circuits", *McGraw-Hill Book Company, 2nd Edition*, (1988),394-396.

Hodges, D. A., "Analysis and Design of Digital Integrated Circuits, 2nd Edition", *McGraw-Hill Publishing. New York*, (1988),354-357.

Hurych, Z., "Influence of Non-Uniform Thickness of Dielectric Layers on Capacitance and Tunnel Currents", *Solid-State Electronics*, 9, (1966),967-979.

Inumiya, S, et al., "Conformable formation of high quality ultra-thin amorphous Ta2 O5 gate dielectrics utilizing water assisted deposition (WAD) for sub 50 nm damascene metal gate MOSFETs", *IEDM Technical Digest. International Electron Devices Meeting*, (Dec. 10-13, 2000),649-652.

Itokawa, H, "Determination of Bandgap and Energy Band Alignment for High-Dielectric-Constant Gate Insulators Using High-Resolution X-ray Photoelectron Spectroscopy", *Extended Abstracts of the 1999 International Conference on Solid State Devices and Materials*, (1999),158-159.

Kim, Yong S., et al., "Effect of rapid thermal annealing on the structure and the electrical properties of atomic-layer-deposited Ta2O5 films", *Journal of the Korean Physical Society*, (Dec. 2000),975-979.

Kim, H., "Leakage current and electrical breakdown in metal-organic chemical vapor deposited TiO/sub 2/ dielectrics on silicon substrates", *Applied Physics Letters*, 69(25), (Dec. 16, 1996),3860-3862.

Kim, Yeong K., et al., "Novel capacitor technology for high density stand-alone and embedded DRAMs", *International Electron Devices Meeting 2000. Technical Digest. IEDM*, (2000),369-372.

Kubaschewski, O., et al., "Oxidation of Metals and Alloys", *Butterworths*, London, (1962),53-63.

Kubaschewski, O., et al., "Oxidation of Metals and Alloys,", *Butterworths*, London, Second Edition,(1962),1-3, 5,6, 8-12, 24, 36-39.

Kukli, Kaupo, "Atomic Layer Deposition of Titanium Oxide from TiI4 and H2O2", *Chemical Vapor Deposition*, 6(6), (2000),303-310.

Kukli, Kaupo, et al., " Atomic layer deposition of zirconium oxide from zirconium tetraiodide, water and hydrogen peroxide", *Journal of Crystal Growth*, 231(1-2), (Sep. 2001),262-272.

Kukli, K., "Development of Dielectric Properties of Niobium Oxide, Tantalum Oxide, and Aluminum Oxide Based Nanolayered Materials", *Journal of the Electrochemical Society*, 148(2), (Feb. 2001),F35-F41.

Kukli, Kaupo, et al., "Real-time monitoring in atomic layer deposition of TiO/sub 2/ from TiI/sub 4/ and H/sub 2/O-H/sub 2/O/sub 2/", *Langmuir*, 16(21), (Oct. 17, 2000),8122-8128.

Kwo, J., "Properties of high k gate dielectrics Gd2O3 and Y2O3 for Si", *Journal of Applied Physics*, 89(7), (2001),3920-3927.

Lee, J., et al., "Effect of polysilicon gate on the flatband voltage shift and mobility degradation for ALD-Al/sub 2/O/sub 3/ gate dielectric", *International Electron Devices Meeting 2000. Technical Digest. IEDM*, (2000),645-648.

Luan, H., "High Quality Ta2O5 Gate Dielectrics with Tox,eq<10A", *IEDM*, (1999),pp. 141-144.

Luan, H. F., "High Quality Ta2O5 Gate Dielectrics with Tox,eq<10A", *IEDM Technical Digest. International Electron Devices Meeting*, (Dec. 5-8, 1999),141-143.

Ma, T P., et al., "Tunneling leakage current in ultrathin (<a4 nm) nitride/oxide stack dielectrics", *IEEE Electron Device Letters*, vol. 19, No. 10,(1998),pp. 388-390.

Ma, Yanjun, et al., "Zirconium oxide based gate dielectrics with equivalent oxide thickness of less than 1.0 nm and performance of submicron MOSFET using a nitride gate replacement process", *International Electron Devices Meeting 1999. Technical Digest*, (1999),149-152.

Manchanda, L., "Si-doped aluminates for high temperature metal-gate CMOS: Zr—Al—Si—O, a novel gate dielectric for low power applications", *IEDM Technical Digest. International Electron Devices Meeting*, (Dec. 10-13, 2000),23-26.

Marshalek, R., et al., "Photoresponse Characteristics of Thin-Film Nickel-Nickel Oxide—Nickel Tunneling Junctions", *IEEE Journal of Quantum Electronics*, QE-19(4), (1983),743-754.

Masuoka, F., et al., "A 256K Flash EEPROM using Triple Polysilicon Technology", *IEEE International Solid-State Circuits Conference, Digest of Technical Papers*, (1985),168-169.

Masuoka, F., et al., "A New Flash EEPROM Cell using Triple Polysilicon Technology", *International Electron Devices Meeting, Technical Digest*, San Francisco, CA,(1984),464-467.

Mori, S., et al., "Reliable CVD Inter-Poly Dielectrics for Advanced E&EEPROM", *Symposium on VSLI Technology, Digest of Technical Papers*, (1985),16-17.

Muller, H., "Electrical and Optical Properties of Sputtered In2O3 Films", *Physica Status Solidi*, 27(2), (1968),723-731.

Paranjpe, Ajit, et al., "Atomic layer deposition of AlOx for thin film head gap applications", *Journal of the Electrochemical Society*, 148(9), (Sep. 2001),465-471.

Pashley, R., et al., "Flash Memories: the best of two worlds", *IEEE Spectrum*, 26(12), (Dec. 1989),30-33.

Ahn, Kie Y., et al., "ALD of Amorphous Lanthanide Doped TIOX Films", U.S. Appl. No. 11/092,072, filed Mar. 29, 2005.

Ahn, Kie Y., et al., "Atomic Layer Deposited Hafnium Tantalum Oxide Dielectrics", U.S. Appl. No. 11/029,757, filed Jan. 5, 2005.

Ahn, Kie Y., et al., "Atomic Layer Deposited Lanthanum Aluminum Oxide Dielectric Layer", U.S. Appl. No. 10/930,167, filed Aug. 31, 2004.

Ahn, Kie Y., et al., "Atomic Layer Deposited Lanthanum Hafnium Oxide Dielectrics", U.S. Appl. No. 11/010,529, filed Dec. 13, 2004.

Ahn, Kie Y., et al., "Atomic Layer Deposited Titanium Aluminum Oxide Films", U.S. Appl. No. 10/931,533, filed Aug. 31, 2004.

Ahn, Kie Y., et al., "Atomic Layer Deposition of Hf3N4/HfO2 Films as Gate Dielectrics", U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., et al., "Atomic Layer Deposition of Zr3N4/ZrO2 Films as Gate Dielectrics", U.S. Appl. No. 11/058,563, filed Feb. 15, 2005.

Ahn, Kie Y., et al., "Hybrid ALD-CVD of PrXOY/ZrO2 Films as Gate Dielectrics", U.S. Appl. No. 11/010,766, filed Dec. 13, 2004.

Ahn, Kie Y., et al., "Ruthenium Gate for a Lanthanide Oxide Dielectric Layer", U.S. Appl. No. 10/926,812, Aug. 26, 2004.

Leskela, M., et al., "ALD Precursor Chemistry: Evolution and Future Challenges", *J. Phys. IV France*, 9, (1999),837-852.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Suntola, Tuomo, "Atomic Layer Epitaxy", *Thin Solid Films*, 216(1), (Aug. 28, 1992),84-89.

Wilk, G. D., et al., "High-K gate dielectrics: Current Status and Materials Properties Considerations", *Journal of Applied Physics*, 89(10), (May 2001),5243-5275.

Xu-Bing, Lu., et al., "Structure and dielectric properties of amorphous LaAlOsub3 and LaAlOsub x Nsub y films as alternative gate dielectric materials", *Journal of Applied Physics*, 94(2), (Jul. 15, 2003),1229-1234.

Ahn, Kie Y., et al., "Magnesium Titanium Oxide Films", U.S. Appl. No. 11/189,075, filed Jul. 25, 2005.

Eitan, Boaz, et al., "NROM: A Novel Localized Trapping, 2-Bit Nonvolatile Memory Cell", *IEEE Electron Device Letters*, 21(11), (Nov. 2000),543-545.

U.S. Appl. No. 11/053,577, Response filed Aug. 1, 2007 to Non-Final Office Action mailed May 2, 2007, 11 pgs.

Final office action mailed Jan. 8, 2003 in U.S. Appl. No. 09/943,134, 13 pgs.

Final office action mailed Oct. 13, 2005 in U.S. Appl. No. 09/945,512, 6 pgs.

Final office action mailed Oct. 5, 2005 in U.S. Appl. No. 10/081,818, 13 pgs.

Final office action mailed Oct. 5, 2005 in U.S. Appl. No. 10/781,035, 16 pgs.

Final office action mailed Nov. 15, 2005 in U.S. Appl. No. 10/931,711, 12 pgs.

Final office action mailed Mar. 12, 2004 in U.S. Appl. No. 09/945,554, 8 pgs.

Non-final office action mailed Jan. 4, 2007 in U.S. Appl. No. 11/202,460, 18 pgs.

Non-final office action mailed Jan. 25, 2007 in U.S. Appl. No. 11/055,380, 19 pgs.

Non-final office action mailed Mar. 16, 2007 in U.S. Appl. No. 11/380,599, 21 pgs.

Non-final office action mailed May 22, 2007 in U.S. Appl. No. 11/216,474, 20 pgs.

Non-final office action mailed May 25, 2007 in U.S. Appl. No. 11/055,380, 5 pgs.

Non-final office action mailed Jun. 1, 2007 in U.S. Appl. No. 11/063,825, 15 pgs.

Non-final office action mailed Aug. 14, 2006 in U.S. Appl. No. 11/062,543, 27 pgs.

Non-Final Office Action mailed Jan. 2, 2003 in U.S. Appl. No. 10/081,818, 12 pgs.

Non-final office action mailed Oct. 14, 2005 in U.S. Appl. No. 11/168,004, 10 pgs.

Non-final office action mailed Oct. 15, 2004 in U.S. Appl. No. 10/081,818, 6 pgs.

Non-final office action mailed Oct. 22, 2003 in U.S. Appl. No. 09/945,554, 7 pgs.

Non-final office action mailed Oct. 26, 2004 in U.S. Appl. No. 10/915,618, 7 pgs.

Non-final office action mailed Nov. 6, 2002 in U.S. Appl. No. 09/945,395, 13 pgs.

Non-final office action mailed Dec. 7, 2006 in U.S. Appl. No. 11/216,474, 36 pgs.

Non-final office action mailed Dec. 13, 2002 in U.S. Appl. No. 09/945,554, 13 pgs.
Non-final office action mailed Dec. 20, 2002 in U.S. Appl. No. 09/945,512, 9 pgs.
Non-final office action mailed Dec. 24, 2002 in U.S. Appl. No. 09/945,500, 5 pgs.
Non-final office action mailed Mar. 24, 2006 in U.S. Appl. No. 10/081,818, 14 pgs.
Non-final office action mailed Apr. 29, 2005 in U.S. Appl. No. 10/081,818, 13 pgs.
Non-final office action mailed May 2, 2007 in U.S. Appl. No. 11/053,577, 15 pgs.
Non-final office action mailed May 30, 2003 in U.S. Appl. No. 10/075,484, 12 pgs.
Non-Final Office Action mailed Jun. 10, 2003 in U.S. Appl. No. 10/177,096, 10 pgs.
Non-Final Office Action mailed Jun. 14, 2005 in U.S. Appl. No. 10/177,096, 18 pgs.
Non-final office action mailed Jun. 17, 2003 in U.S. Appl. No. 09/945,507, 7.
Non-final office action mailed Jun. 2, 2005 in U.S. Appl. No. 10/781,035, 14 pgs.
Non-final office action mailed Jun. 22, 2004 in U.S. Appl. No. 10/781,035, 4 pgs.
Non-final office action mailed Jun. 28, 2005 in U.S. Appl. No. 10/931,711, 24 pgs.
Non-final office action mailed Jun. 30, 2005 in U.S. Appl. No. 09/945,512, 8 pgs.
Non-final office action mailed Jul. 1, 2005 in U.S. Appl. No. 10/783,695, 8 pgs.
Non-final office action mailed Aug. 12, 2004 in U.S. Appl. No. 10/788,810, 15 pgs.
Non-final office action mailed Sep. 21, 2004 in U.S. Appl. No. 10/819,550, 18 pgs.
Notice of allowance mailed Jan. 26, 2007 in U.S. Appl. No. 11/062,543, 17 pgs.
Notice of allowance mailed May 17, 2007 in U.S. Appl. No. 11/202,460, 6 pgs.
Notice of allowance mailed Jun. 27, 2007 in U.S. Appl. No. 11/062,543, 20 pgs.
Notice of allowance mailed Jan. 28, 2005 in U.S. Appl. No. 10/819,550, 7 pgs.
Notice of allowance mailed Jan. 30, 2006 in U.S. Appl. No. 10/781,035, 5 pgs.
Notice of allowance mailed Jan. 31, 2006 in U.S. Appl. No. 09/945,512, 4 pgs.
Notice of Allowance mailed Jan. 4, 2005 in U.S. Appl. No. 10/929,986, 7 pgs.
Notice of allowance mailed Jan. 9, 2006 in U.S. Appl. No. 10/788,810, 9 pgs.
Notice of allowance mailed Oct. 28, 2004 in U.S. Appl. No. 10/781,035, 5 pgs.
Notice of Allowance mailed Oct. 6, 2005 in U.S. Appl. No. 10/177,096, 8 pgs.
Notice of allowance mailed Nov. 14, 2003 in U.S. Appl. No. 10/177,096, 3 pgs.
Notice of allowance mailed Nov. 18, 2003 in U.S. Appl. No. 10/075,484, 5 pgs.
Notice of allowance mailed Nov. 18, 2004 in U.S. Appl. No. 09/945,507, 7 pgs.
Notice of allowance mailed Nov. 22, 2004 in U.S. Appl. No. 09/944,554, 2 pgs.
Notice of allowance mailed Nov. 3, 2003 in U.S. Appl. No. 09/945,507, 7 pgs.
Notice of allowance mailed Nov. 5, 2004 in U.S. Appl. No. 09/943,134, 4 pgs.
Notice of allowance mailed Dec. 11, 2003 in U.S. Appl. No. 09/945,512, 7 pgs.
Notice of allowance mailed Dec. 12, 2003 in U.S. Appl. No. 09/945,500, 5 pgs.
Notice of allowance mailed Dec. 13, 2004 in U.S. Appl. No. 10/931,540, 12 pgs.
Notice of allowance mailed Dec. 2, 2005 in U.S. Appl. No. 09/945,500, 2 pgs.
Notice of allowance mailed Dec. 20, 2005 in U.S. Appl. No. 10/783,695, 4 pgs.
Notice of allowance mailed Dec. 29, 2005 in U.S. Appl. No. 09/945,507, 2 pgs.
Notice of allowance mailed Dec. 30, 2003 in U.S. Appl. No. 09/945,395, 4 pgs.
Notice of Allowance mailed Feb. 13, 2004 in U.S. Appl. No. 10/081,818, 9 pgs.
Notice of allowance mailed Feb. 13, 2004 in U.S. Appl. No. 09/943,134, 4 pgs.
Notice of allowance mailed Feb. 13, 2006 in U.S. Appl. No. 11/168,004, 5 pgs.
Notice of Allowance mailed Feb. 22, 2005 in U.S. Appl. No. 10/081,818, 7 pgs.
Notice of allowance mailed Feb. 22, 2005 in U.S. Appl. No. 09/945,512, 7 pgs.
Notice of allowance mailed Feb. 28, 2003 in U.S. Appl. No. 09/945,395, 9 pgs.
Notice of allowance mailed Mar. 22, 2005 in U.S. Appl. No. 10/788,810, 7 pgs.
Notice of allowance mailed Mar. 29, 2005 in U.S. Appl. No. 09/945,500, 4 pgs.
Notice of Allowance mailed Mar. 8, 2007 in U.S. Appl. No. 10/081,818, 8 pgs.
Notice of allowance mailed Mar. 8, 2007 in U.S. Appl. No. 10/929,986, 6 pgs.
Notice of allowance mailed Mar. 9, 2004 in U.S. Appl. No. 09/945,507, 5 pgs.
Notice of allowance mailed Mar. 9, 2005 in U.S. Appl. No. 10/915,618, 6 pgs.
Notice of allowance mailed Apr. 5, 2004 in U.S. Appl. No. 10/075,484, 7 pgs.
Notice of allowance mailed Apr. 20, 2005 in U.S. Appl. No. 10/931,540, 8 pgs.
Notice of Allowance mailed Apr. 21, 2005 in U.S. Appl. No. 10/929,986, 12 pgs.
Notice of allowance mailed Apr. 21, 2005 in U.S. Appl. No. 10/929,986, 12 pgs.
Notice of Allowance mailed Apr. 6, 2004 in U.S. Appl. No. 10/177,096, 7 pgs.
Notice of allowance mailed Apr. 7, 2005 in U.S. Appl. No. 09/943,134, 4 pgs.
Notice of Allowance mailed May 18, 2006 in U.S. Appl. No. 10/177,096, 7 pgs.
Notice of allowance mailed May 18, 2006 in U.S. Appl. No. 10/781,035, 5 pgs.
Notice of allowance mailed May 19, 2004 in U.S. Appl. No. 09/945,500, 4 pgs.
Notice of allowance mailed May 2, 2003 in U.S. Appl. No. 09/944,554, 8 pgs.
Notice of allowance mailed May 27, 2004 in U.S. Appl. No. 09/945,512, 7 pgs.
Notice of allowance mailed May 31, 2006 in U.S. Appl. No. 10/931,711, 9 pgs.
Notice of allowance mailed May 4, 2006 in U.S. Appl. No. 10/929,986, 5 pgs.
Notice of allowance mailed Jun. 1, 2004 in U.S. Appl. No. 09/944,554, 2 pgs.
Notice of allowance mailed Jun. 17, 2003 in U.S. Appl. No. 09/945,512, 12 pgs.
Notice of allowance mailed Jun. 3, 2005 in U.S. Appl. No. 09/945,507, 2 pgs.
Notice of allowance mailed Jun. 4, 2003 in U.S. Appl. No. 09/943,134, 5 pgs.
Notice of allowance mailed Jul. 28, 2005 in U.S. Appl. No. 10/788,810, 9 pgs.
Notice of allowance mailed Jul. 30, 2003 in U.S. Appl. No. 09/945,395, 5 pgs.
Notice of allowance mailed Aug. 12, 2005 in U.S. Appl. No. 09/945,500, 2 pgs.

Notice of allowance mailed Aug. 22, 2006 in U.S. Appl. No. 10/783,695, 5 pgs.
Notice of allowance mailed Sep. 18, 2006 in U.S. Appl. No. 10/931,711, 8 pgs.
Notice of Allowance mailed Sep. 21, 2006 in U.S. Appl. No. 10/081,818, 5 pgs.
Notice of allowance mailed Sep. 21, 2006 in U.S. Appl. No. 10/929,986, 7 pgs.
Notice of Allowance mailed Sep. 26, 2003 in U.S. Appl. No. 10/081,818, 12 pgs.
Response filed Feb. 27, 2007 to non-final office action mailed Dec. 7, 2006 in U.S. Appl. No. 11/216,474, 25 pgs.
Response filed Mar. 23, 2007 to non-final office action mailed Jan. 4, 2007 in U.S. Appl. No. 11/202,460, 17 pgs.
Response filed Apr. 24, 2007 to non-final office action mailed Jan. 25, 2007 in U.S. Appl. No. 11/055,380, 18 pgs.
Response filed Jul. 13, 2007 to non-final office action mailed Mar. 16, 2007 in U.S. Appl. No. 11/380,599, 24 pgs.
Response filed Jan. 13, 2006 to final office action mailed Jan. 28, 2006 in U.S. Appl. No. 09/945,512, 28 pgs.
Response filed Jan. 14, 2005 to non final office action mailed Oct. 15, 2004 in U.S. Appl. No. 10/081,818, 16 pgs.
Response filed Jan. 17, 2006 to final office action mailed Jan. 17, 2006 in U.S. Appl. No. 11/168,004, 22 pgs.
Response filed Jan. 17, 2006 to final office action mailed Jan. 17, 2006 in U.S. Appl. No. 10/931,711, 28 pgs.
Response filed Jan. 22, 2004 to final office action mailed Oct. 22, 2003 in U.S. Appl. No. 09/945,554, 35 pgs.
Response filed Jan. 26, 2005 to final office action mailed Jan. 26, 2005 in U.S. Appl. No. 10/915,618, 24 pgs.
Response filed Jan. 5, 2006 to final office action mailed Oct. 5, 2005 in U.S. Appl. No. 10/781,035, 20 pgs.
Response filed Oct. 10, 2003 to non final office action mailed Oct. 10, 2003 in U.S. Appl. No. 10/177,096, 55.
Response filed Nov. 3, 2006 to non-final office action mailed Aug. 14, 2006 in U.S. Appl. No. 11/062,543, 20 pgs.
Response filed Dec. 13, 2004 to no-final office action mailed Dec. 13, 2004 in U.S. Appl. No. 10/788,810, 22 pgs.
Response filed Dec. 21, 2004 to non-final office action mailed Dec. 21, 2004 in U.S. Appl. No. 10/819,550, 27 pgs.
Response filed Feb. 6, 2003 to final office action mailed Nov. 6, 2002 in U.S. Appl. No. 09/945,395, 8 pgs.
Response filed Mar. 13, 2003 to final office action mailed Dec. 13, 2002 in U.S. Appl. No. 09/945,554, 29 pgs.
Response filed Mar. 20, 2003 to non-final office action mailed Mar. 20, 2003 in U.S. Appl. No. 09/945,512, 30 pgs.
Response filed Mar. 24, 2003 to final office action mailed Dec. 24, 2002 in U.S. Appl. No. 09/945,500, 17 pgs.
Response filed Mar. 3, 2006 to final office action mailed Oct. 5, 2005 in U.S. Appl. No. 10/081,818, 14 pgs.
Response filed Apr. 2, 2003 to non final office action mailed Jan. 2, 2003 in U.S. Appl. No. 10/081,818, 12 pgs.
Response filed May 12, 2004 to final office action mailed Mar. 12, 2004 in U.S. Appl. No. 09/945,554, 21 pgs.
Response filed Jul. 29, 2005 to non final office action mailed Jul. 29, 2005 in U.S. Appl. No. 10/081,818, 21 pgs.
Response filed Aug. 17, 2003 to final office action mailed Jun. 17, 2003 in U.S. Appl. No. 09/945,507, 15 pgs.
Response filed Aug. 24, 2006 to non final office action mailed Aug. 24, 2006 in U.S. Appl. No. 10/081,818, 16 pgs.
Response filed Aug. 3, 2005 to non final office action mailed Jul. 1, 2005 in U.S. Appl. No. 10/783,695, 24 pgs.
Response filed Sep. 1, 2005 to non final office action mailed Sep. 2, 2005 in U.S. Appl. No. 10/781,035, 26 pgs.
Response filed Sep. 2, 2003 to final office action mailed Sep. 2, 2003 in U.S. Appl. No. 10/075,484, 50 pgs.
Response filed Sep. 22, 2004 to non final office action mailed Jun. 22, 2004 in U.S. Appl. No. 10/781,035, 11 pgs.
Response filed Sep. 28, 2005 to non-final office action mailed Sep. 28, 2005 in U.S. Appl. No. 10/931,711, 34 pgs.
Response filed Sep. 29, 2005 to non-final office action mailed Sep. 29, 2005 in U.S. Appl. No. 09/945,512, 10 pgs.
Response filed Sep. 8, 2005 to non final office action mailed Sep. 8, 2005 in U.S. Appl. No. 10/177,096, 34 pgs.
Application Partial File History U.S. Appl. No. 11/216,474, (Downloaded from IFW Oct. 24, 2007), 81 pgs.
Application Partial File History U.S. Appl. No. 11/329,025, (downloaded from IFW Oct. 24, 2007), 46 pgs.
Application Partial File History U.S. Appl. No. 11/566,038, (Downloaded from IFW Oct. 24, 2007), 37 pgs.
Application Partial File History U.S. Appl. No. 09/943,134, Amendment Under 37 CFR 1.312 mailed Jun. 10, 2005, 6 pgs.
Application U.S. Appl. No. 09/943,134, Response filed Apr. 8, 2003 to Non Final Office Action mailed Jan. 8, 2003, 15 pgs.
Application U.S. Appl. No. 09/945,395 Amendment Under 37 CFR 1.312 mailed Feb. 10, 2004, 15 pgs.
Application U.S. Appl. No. 09/945,395, Amendment Under 37 CFR 1.312 mailed Apr. 17, 2003, 4 pgs.
Application U.S. Appl. No. 09/945,512, Amendment filed Feb. 11, 2004, 23 pgs.
Application U.S. Appl. No. 10/028,001, Response filed Jan. 12, 2006 Non-Final Office Action mailed Oct. 12, 2005, 15 pgs.
Application U.S. Appl. No. 10/028,001, Response filed Feb. 2, 2005 Non-Final Office Action mailed Nov. 2, 2004, 12 pgs.
Application U.S. Appl. No. 10/028,001, Response filed May 14, 2003 Non-Final Office Action mailed Feb. 14, 2003, 27 pgs.
Application U.S. Appl. No. 10/081,818, Response filed Jan. 14, 2005 Non-Final Office Action mailed Oct. 5, 2005, 14 pgs.
Application U.S. Appl. No. 10/081,818, Response filed Mar. 3, 2006 Final Office Action mailed Oct. 5, 2005, 14 pgs.
Application U.S. Appl. No. 10/783,695 Amendment Under 37 CFR 1.312 mailed Nov. 20, 2006, 21 pgs.
Application U.S. Appl. No. 10/819,550 Amendment Under 37 CFR 1.312 mailed Mar. 31, 2005, 13 pgs.
Application U.S. Appl. No. 10/926,916 Response filed Apr. 26, 2006 Non-Final Office Action mailed Jan. 26, 2006, 27 pgs.
Application U.S. Appl. No. 10/931,540 Amendment Under 37 CFC 1.312 mailed May 12, 2005, 17 pgs.
Application U.S. Appl. No. 11/055,380, Notice of Allowance mailed Sep. 20, 2007, 8 pgs.
Application U.S. Appl. No. 11/055,380, Response filed Aug. 22, 2007 to Non Final Office Action mailed May 25, 2007, 12 pgs.
Application U.S. Appl. No. 11/063,825, Response filed Aug. 31, 2007 to Non-Final Office Action mailed Jun. 1, 2007, 14 pgs.
Application U.S. Appl. No. 11/216,474, Response to Non Final Office Action mailed May 22, 2007 filed Aug. 21, 2007, 16 pgs.
Application U.S. Appl. No. 11/216,474, Response filed Aug. 21, 2007 to Non-Final Office Action mailed May 22, 2007, 16 pgs.
Application U.S. Appl. No. 11/380,599 Notice of Allowance Mailed Aug. 16, 2007, 8 pgs.
Application U.S. Appl. No. 11/471,007, Non-Final Office Action Mailed Aug. 16, 2007, 15 pgs.
Application U.S. Appl. No. 11/471,008, Non Final Office Action Mailed Aug. 15, 2007, 17 pgs.
Application U.S. Appl. No. 11/471,348, Non-Final Office Action mailed Aug. 23, 2007, 12 pgs.
Application U.S. Appl. No. 10/081,818, Notice of Allowance mailed Oct. 30, 2007, 7 pgs.
Application U.S. Appl. No. 10/929,986 Notice of Allowance mailed Oct. 29, 2007, 7 pgs.
Application U.S. Appl. No. 11/708,438, Non Final Office Action mailed Oct. 29, 2007, 5 pgs.
Application U.S. Appl. No. 11/055,380, Partial File History (as of Oct. 29, 2007), 102 pgs.
"Application U.S. Appl. No. 11/062,543, Response filed Dec. 31, 2007 to Non-Final Office Action mailed Dec 7, 2007", 10 pgs.
"Application U.S. Appl. No. 11/062,543, Non-Final Office Action mailed Dec 7, 2007", 8 pgs.
"Application U.S. Appl. No. 11/215,578 Response to Restriction Requirement mailed Nov. 9, 2007", 12 pgs.
"Application U.S. Appl. No. 11/215,578, Restriction Requirement mailed", 4 pgs.
"Application U.S. Appl. No. 11/216,474, Non-Final Office Action mailed Dec. 7, 2006", 15 pgs.

"Application U.S. Appl. No. 11/216,474, Notice of Allowance mailed Nov. 7, 2007", 2 pgs.

"Application U.S. Appl. No. 11/216,474, Response filed Oct. 13, 2006 to Restriction Requirment mailed Sep. 13, 2006", 11 pgs.

"Application U.S. Appl. No. 11/216,474, Response filed Aug. 21, 2007 to Non-Final Office Action mailed May 22, 2007", 16 pgs.

"Application U.S. Appl. No. 11/216,474, Restriction Requirement mailed Sep. 13, 2006", 4 pgs.

"Application U.S. Appl. No. 11/471,007, Response filed Nov. 16, 2007 to Non-Final Office Action mailed Aug. 15, 2007", 10 pgs.

"Application U.S. Appl. No. 11/471,008, Response filed Dec. 20, 2007 to Non-Final Office Action mailed Aug. 15, 2007", 10 pgs.

"Application U.S. Appl. No. 11/471,348, Notice of Allowance mailed Jan. 4, 2008", 4 pgs.

"Application U.S. Appl. No. 11/471,348, Response filed Nov. 21, 2007 to Non-Final Office Action mailed Aug. 23, 2007", 10 p.

"Application U.S. Appl. No. 11/704,458, Non-Final Office Action mailed Nov. 1, 2007", 19 pgs.

"Application U.S. Appl. No. 11/471,007, Notice of Allowance mailed Jan. 4, 2008", 4 pgs.

Alers, G. B. et al., "Intermixing at the tantalum oxide/silicon interface in gate dielectric structures", *Applied Physics Letters*, 73(11), (Sep. 14, 1998), 1517-1519.

Atanassova, E., et al., "Breakdown Fields and Conduction Mechanisms in thin $Ta_2O_5$ Layers on Si for high density DRAMs", *Microelectronics Reliability*, 42, (2002), 157-173.

Duenas, et al., "Interface Quality of High-Pressure Reactive Sputterd and Atomic Layer Deposited Titanium oxide thin Films on Silicon", *IEEE Transaction*, Spanish Conference on Electronic Devices, (Feb. 2-4, 2005), 49-52.

Ritala, et al., "Atomic layer epitaxy-a valuable tool for nanotechnology?",. *Nanotechnolgy* 10, (1999), 19-24.

US 7,183,605, 02/2007, Eldridge et al. (withdrawn)

* cited by examiner

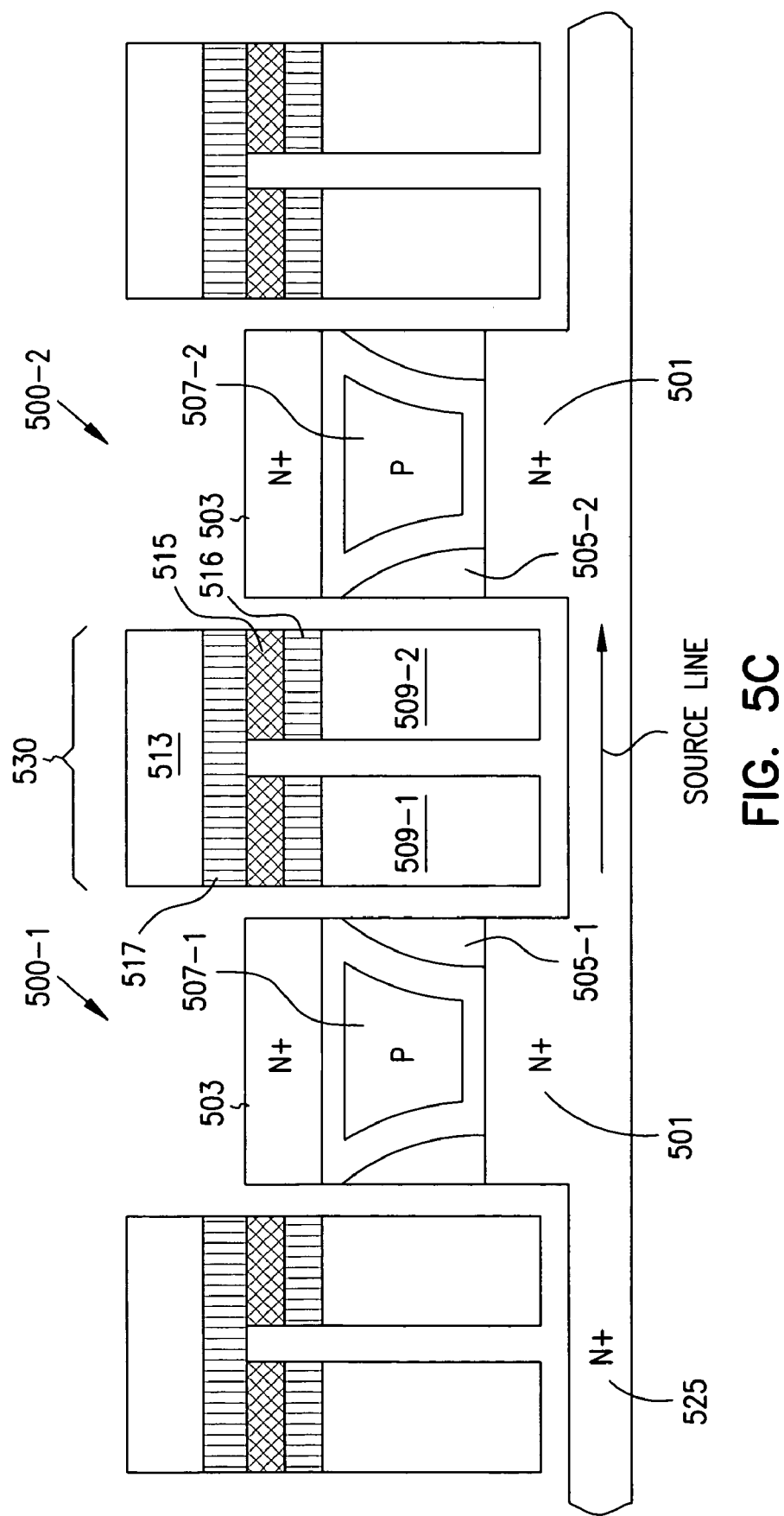

FLASH MEMORY WITH LOW TUNNEL BARRIER INTERPOLY INSULATORS

CROSS REFERENCE TO RELATED APPLICATIONS

This application is a divisional of U.S. application Ser. No. 09/945,507 filed Aug. 30, 2001 now U.S. Pat. No. 7,068,544 which is incorporated herein by reference.

This application is related to the following co-pending, commonly assigned U.S. patent applications: "DRAM Cells with Repressed Memory Metal Oxide Tunnel Insulators," Ser. No. 09/945,395, "Programmable Array Logic or Memory Devices with Asymmetrical Tunnel Barriers," Ser. No. 09/943,134, "Dynamic Electrically Alterable Programmable Memory with Insulating Metal Oxide Interpoly Insulators," Ser. No. 09/945,498, and "Field Programmable Logic Arrays with Metal Oxide and/or Low Tunnel Barrier Interpoly Insulators," Ser. No. 09/945,512, "SRAM Cells with Repressed Floating Gate Memory, Metal Oxide Tunnel Interpoly Insulators," Ser. No. 09/945,554, "Programmable Memory Address and Decode Devices with Low Tunnel Barrier Interpoly Insulators," Ser. No. 09/945,500, which are filed on even date herewith and each of which disclosure is herein incorporated by reference.

FIELD OF THE INVENTION

The present invention relates generally to integrated circuits, and in particular to Flash memory with low tunnel barrier interpoly insulators.

BACKGROUND OF THE INVENTION

Flash memories have become widely accepted in a variety of applications ranging from personal computers, to digital cameras and wireless phones. Both INTEL and AMD have separately each produced about one billion integrated circuit chips in this technology.

The original EEPROM or EARPROM and flash memory devices described by Toshiba in 1984 used the interpoly dielectric insulator for erase. (See generally, F. Masuoka et al., "A new flash EEPROM cell using triple polysilicon technology," IEEE Int. Electron Devices Meeting, San Francisco, pp. 464-67, 1984; F. Masuoka et al., "256K flash EEPROM using triple polysilicon technology," IEEE Solid-State Circuits Conf., Philadelphia, pp. 168-169, 1985). Various combinations of silicon oxide and silicon nitride were tried. (See generally, S. Mori et al., "reliable CVD inter-poly dialectics for advanced E&EEPROM," Symp. On VLSI Technology, Kobe, Japan, pp. 16-17, 1985). However, the rough top surface of the polysilicon floating gate resulted in, poor quality interpoly oxides, sharp points, localized high electric fields, premature breakdown and reliability problems.

Widespread use of flash memories did not occur until the introduction of the ETOX cell by INTEL in 1988. (See generally, U.S. Pat. No. 4,780,424, "Process for fabricating electrically alterable floating gate memory devices," 25 Oct. 1988; B. Dipert and L. Hebert, "Flash memory goes mainstream," IEEE Spectrum, pp. 48-51, October, 1993; R. D. Pashley and S. K. Lai, "Flash memories, the best of two worlds," IEEE Spectrum, pp. 30-33, December 1989). This extremely simple cell and device structure resulted in high densities, high yield in production and low cost. This enabled the widespread use and application of flash memories anywhere a non-volatile memory function is required. However, in order to enable a reasonable write speed the ETOX cell uses channel hot electron injection, the erase operation which can be slower is achieved by Fowler-Nordhiem tunneling from the floating gate to the source. The large barriers to electron tunneling or hot electron injection presented by the silicon oxide-silicon interface, 3.2 eV, result in slow write and erase speeds even at very high electric fields. The combination of very high electric fields and damage by hot electron collisions in the oxide result in a number of operational problems like soft erase error, reliability problems of premature oxide breakdown and a limited number of cycles of write and erase.

Other approaches to resolve the above described problems include; the use of different floating gate materials, e.g. SiC, SiOC, GaN, and GaAlN, which exhibit a lower work function (see FIG. 1A), the use of structured surfaces which increase the localized electric fields (see FIG. 1B), and amorphous SiC gate insulators with larger electron affinity, $\chi$, to increase the tunneling probability and reduce erase time (see FIG. 1C).

One example of the use of different floating gate (FIG. 1A) materials is provided in U.S. Pat. No. 5,801,401 by L. Forbes, entitled "FLASH MEMORY WITH MICROCRYSTALLINE SILICON CARBIDE AS THE FLOATING GATE STRUCTURE." Another example is provided in U.S. Pat. No. 5,852,306 by L. Forbes, entitled "FLASH MEMORY WITH NANOCRYSTALLINE SILICON FILM AS THE FLOATING GATE." Still further examples of this approach are provided in pending applications by L. Forbes and K. Ahn, entitled "DYNAMIC RANDOM ACCESS MEMORY OPERATION OF A FLASH MEMORY DEVICE WITH CHARGE STORAGE ON A LOW ELECTRON AFFINITY GaN OR GaAlN FLOATING GATE," Ser. No. 08/908,098, and "VARIABLE ELECTRON AFFINITY DIAMOND-LIKE COMPOUNDS FOR GATES IN SILICON CMOS MEMORIES AND IMAGING DEVICES," Ser. No. 08/903,452.

An example of the use of the structured surface approach (FIG. 1B) is provided in U.S. Pat. No. 5,981,350 by J. Geusic, L. Forbes, and K. Y. Ahn, entitled "DRAM CELLS WITH A STRUCTURE SURFACE USING A SELF STRUCTURED MASK." Another example is provided in U.S. Pat. No. 6,025,627 by L. Forbes and J. Geusic, entitled "ATOMIC LAYER EXPITAXY GATE INSULATORS AND TEXTURED SURFACES FOR LOW VOLTAGE FLASH MEMORIES."

Finally, an example of the use of amorphous SiC gate insulators (FIG. 1C) is provided in U.S. patent application Ser. No. 08/903,453 by L. Forbes and K. Ahn, entitled "GATE INSULATOR FOR SILICON INTEGRATED CIRCUIT TECHNOLOGY BY THE CARBURIZATION OF SILICON."

Additionally, graded composition insulators to increase the tunneling probability and reduce erase time have been described by the same inventors. (See, L. Forbes and J. M. Eldridge, "GRADED COMPOSITION GATE INSULATORS TO REDUCE TUNNELING BARRIERS IN FLASH MEMORY DEVICES," application Ser. No. 09/945,514.

However, all of these approaches relate to increasing tunneling between the floating gate and the substrate such as is employed in a conventional ETOX device and do not involve tunneling between the control gate and floating gate through and inter-poly dielectric.

Therefore, there is a need in the art to provide improved flash memory densities while avoiding the large barriers to electron tunneling or hot electron injection presented by the silicon oxide-silicon interface, 3.2 eV, which result in slow write and erase speeds even at very high electric fields. There is also a need to avoid the combination of very high electric fields and damage by hot electron collisions in the which oxide result in a number of operational problems like soft erase error, reliability problems of premature oxide breakdown and a limited number of cycles of write and erase. Further, when using an interpoly dielectric insulator erase approach, the above mentioned problems of having a rough top surface on the polysilicon floating gate which results in, poor quality interpoly oxides, sharp points, localized high electric fields, premature breakdown and reliability problems must be avoided.

SUMMARY OF THE INVENTION

The above mentioned problems with flash memories and other problems are addressed by the present invention and will be understood by reading and studying the following specification. Systems and methods are provided for flash memories with metal oxide and/or low tunnel barrier interpoly insulators.

In one embodiment of the present invention, the non-volatile memory includes a first source/drain region and a second source/drain region separated by a channel region in a substrate. A floating gate opposing the channel region and is separated therefrom by a gate oxide. A control gate opposes the floating gate. The control gate is separated from the floating gate by a low tunnel barrier intergate insulator. The low tunnel barrier intergate insulator includes a metal oxide insulator selected from the group consisting of PbO, $Al_2O_3$, $Ta_2O_5$, $TiO_2$, $ZrO_2$, and $Nb_2O_5$. The floating gate includes a polysilicon floating gate having a metal layer formed thereon in contact with the low tunnel barrier intergate insulator. And, the control gate includes a polysilicon control gate having a metal layer formed thereon in contact with the low tunnel barrier intergate insulator.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIGS. 5A-5E are cross sectional views taken along cut line 5-5 from FIG. 4 illustrating a number of floating gate and control gate configurations which are included in the scope of the present invention.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 2:
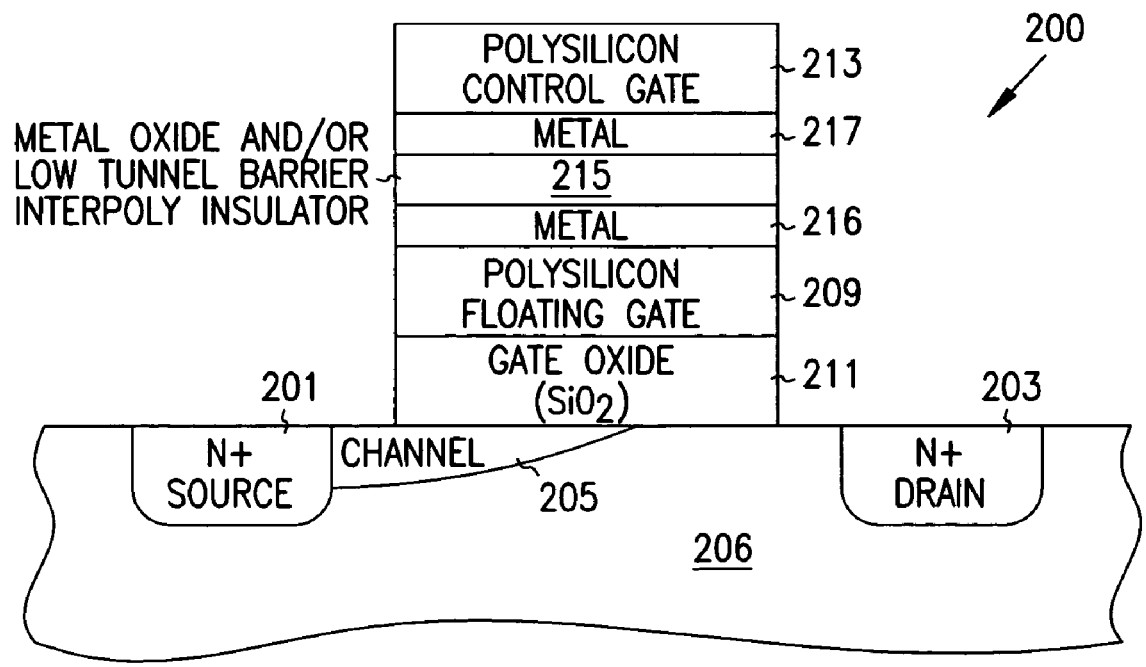
FIG. 2 illustrates one embodiment of a floating gate transistor, or non-volatile memory cell, according to the teachings of the present invention.

The present invention, describes the use of metal oxide inter-poly dielectric insulators between the control gate and the floating gate. An example is shown in FIG. 2 for a planar structure, or horizontal non-volatile memory cell. According to the teachings of the present invention. The use of metal oxide films for this purpose offer a number of advantages including:

(i) Flexibility in selecting a range of smooth metal film surfaces and compositions that can be oxidized to form tunnel barrier insulators.

(ii) Employing simple "low temperature oxidation" to produce oxide films of highly controlled thickness, composition, purity and uniformity.

(iii) Avoiding inadvertent inter-diffusion of the metal and silicon as well as silicide formation since the oxidation can be carried out at such low temperatures.

(iv) Using metal oxides that provide desirably lower tunnel barriers, relative to barriers currently used such as $SiO_2$.

(v) Providing a wide range of higher dielectric constant oxide films with improved capacitance characteristics.

(vi) Providing a unique ability to precisely tailor tunnel oxide barrier properties for various device designs and applications.

(vii) Permitting the use of thicker tunnel barriers, if needed, to enhance device performance and its control along with yield and reliability.

(viii) Developing layered oxide tunnel barriers by oxidizing layered metal film compositions in order, for example, to enhance device yields and reliability more typical of single insulating layers.

(ix) Eliminating soft erase errors caused by the current technique of tunnel erase from floating gate to the source.

FIG. 2 illustrates one embodiment of a floating gate transistor, or non-volatile memory cell 200, according to the teachings of the present invention. As shown in FIG. 2, the non-volatile memory cell 200 includes a first source/drain region 201 and a second source/drain region 203 separated by a channel region 205 in a substrate 206. A floating gate 209 opposes the channel region 205 and is separated therefrom by a gate oxide 211. A control gate 213 opposes the floating gate 209. According to the teachings of the present invention, the control gate 213 is separated from the floating gate 209 by a low tunnel barrier intergate insulator 215.

In one embodiment of the present invention, low tunnel barrier intergate insulator 215 includes a metal oxide insulator selected from the group consisting of lead oxide (PbO) and aluminum oxide ($Al_2O_3$). In an alternative embodiment of the present invention, the low tunnel barrier intergate insulator 215 includes a transition metal oxide and the transition metal oxide is selected from the group consisting of $Ta_2O_5$, $TiO_2$, $ZrO_2$, and $Nb_2O_5$. In still another alternative embodiment of the present invention, the low tunnel barrier intergate insulator 215 includes a Perovskite oxide tunnel barrier.

According to the teachings of the present invention, the floating gate 209 includes a polysilicon floating gate 209 having a metal layer 216 formed thereon in contact with the low tunnel barrier intergate insulator 215. Likewise, the control gate 213 includes a polysilicon control gate 213 having a metal layer 217 formed thereon in contact with the low tunnel barrier intergate insulator 215. In this invention, the metal layers, 216 and 217, are formed of the same metal material used to form the metal oxide interpoly insulator 215.

Figure 3:
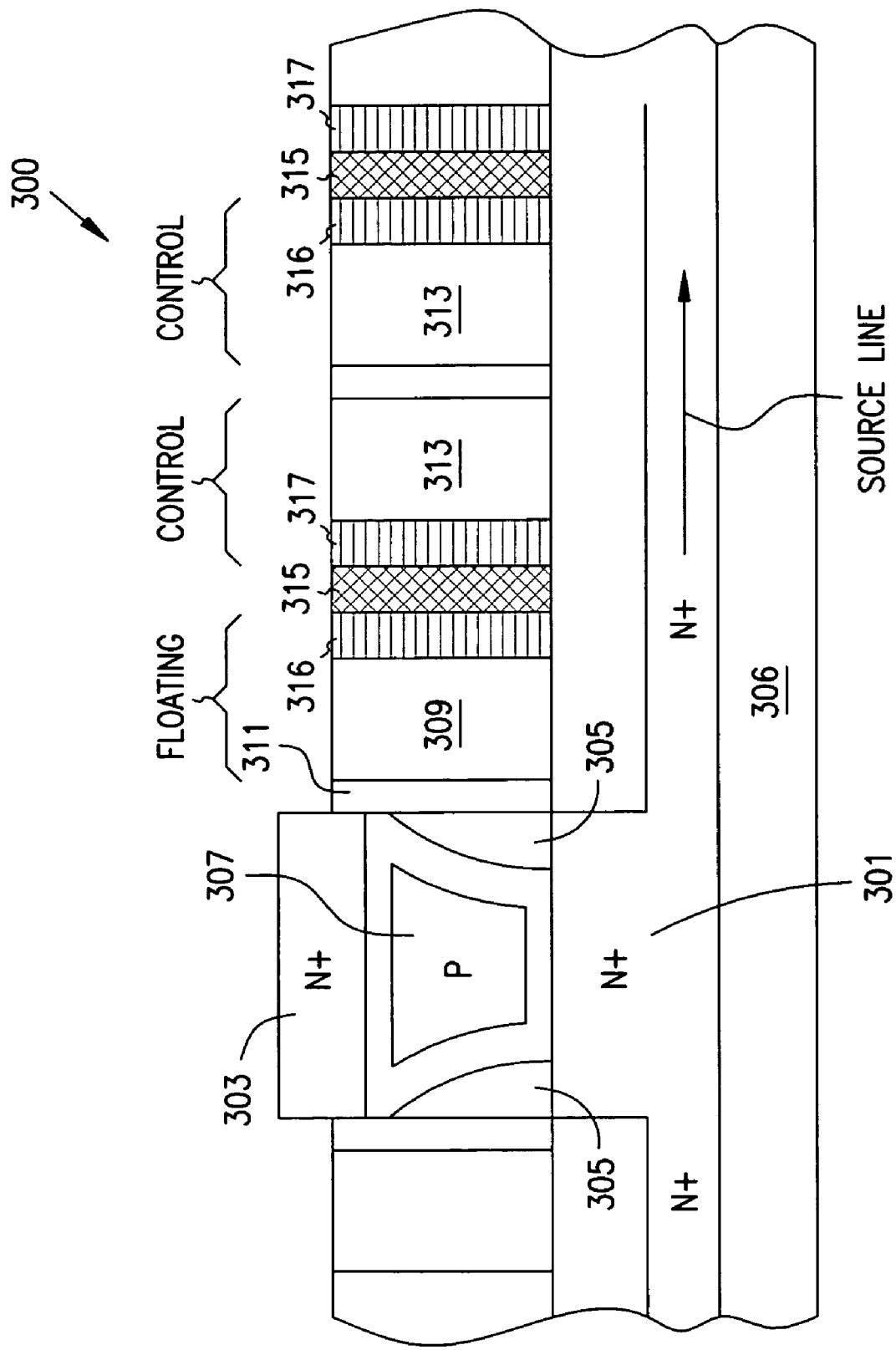
FIG. 3 illustrates another embodiment of a floating gate transistor, or non-volatile memory cell, according to the teachings of the present invention.

FIG. 3 illustrates another embodiment of a floating gate transistor, or non-volatile memory cell 300, according to the teachings of the present invention. As shown in the embodiment of FIG. 3, the non-volatile memory cell 300 includes a vertical non volatile memory cell 300. In this embodiment, the non-volatile memory cell 300 has a first source/drain region 301 formed on a substrate 306. A body region 307 including a channel region 305 is formed on the first source/drain region 301. A second source/drain region 303 is formed on the body region 307. Methods for forming such a vertical transistor structure are disclosed in U.S. Pat. No. 6,135,175, entitled "Memory Address Decode Array with vertical transistors, which is incorporated herein by reference. A floating gate 309 opposes the channel region 305 and is separated therefrom by a gate oxide 311. A control gate 313 opposes the floating gate 309. According to the teachings of the present invention, the control gate 313 is separated from the floating gate 309 by a low tunnel barrier intergate insulator 315.

According to the teachings of the present invention, the low tunnel barrier intergate insulator 315 includes a metal oxide insulator 315 selected from the group consisting of PbO, $Al_2O_3$, $Ta_2O_5$, $TiO_2$, $ZrO_2$, $Nb_2O_5$. In still another alternative embodiment of the present invention, the low tunnel barrier intergate insulator 315 includes a Perovskite oxide tunnel barrier. The floating gate 309 includes a polysilicon floating gate 309 having a metal layer 316 formed thereon in contact with the low tunnel barrier intergate insulator 315. The control gate 313 includes a polysilicon control gate 313 having a metal layer 317 formed thereon in contact with the low tunnel barrier intergate insulator 315.

As shown in FIG. 3, the floating gate 309 includes a vertical floating gate 309 formed alongside of the body region 307. In the embodiment shown in FIG. 3, the control gate 313 includes a vertical control gate 313 formed alongside of the vertical floating gate 309.

As will be explained in more detail below, the floating gate 309 and control gate 313 orientation shown in FIG. 3 is just one embodiment for a vertical non volatile memory cell 300, according to the teachings of the present invention. In other embodiments, explained below, the floating gate includes a horizontally oriented floating gate formed alongside of the body region. In this alternative embodiment, the control gate includes a horizontally oriented control gate formed above the horizontally oriented floating gate.

Figure 4:
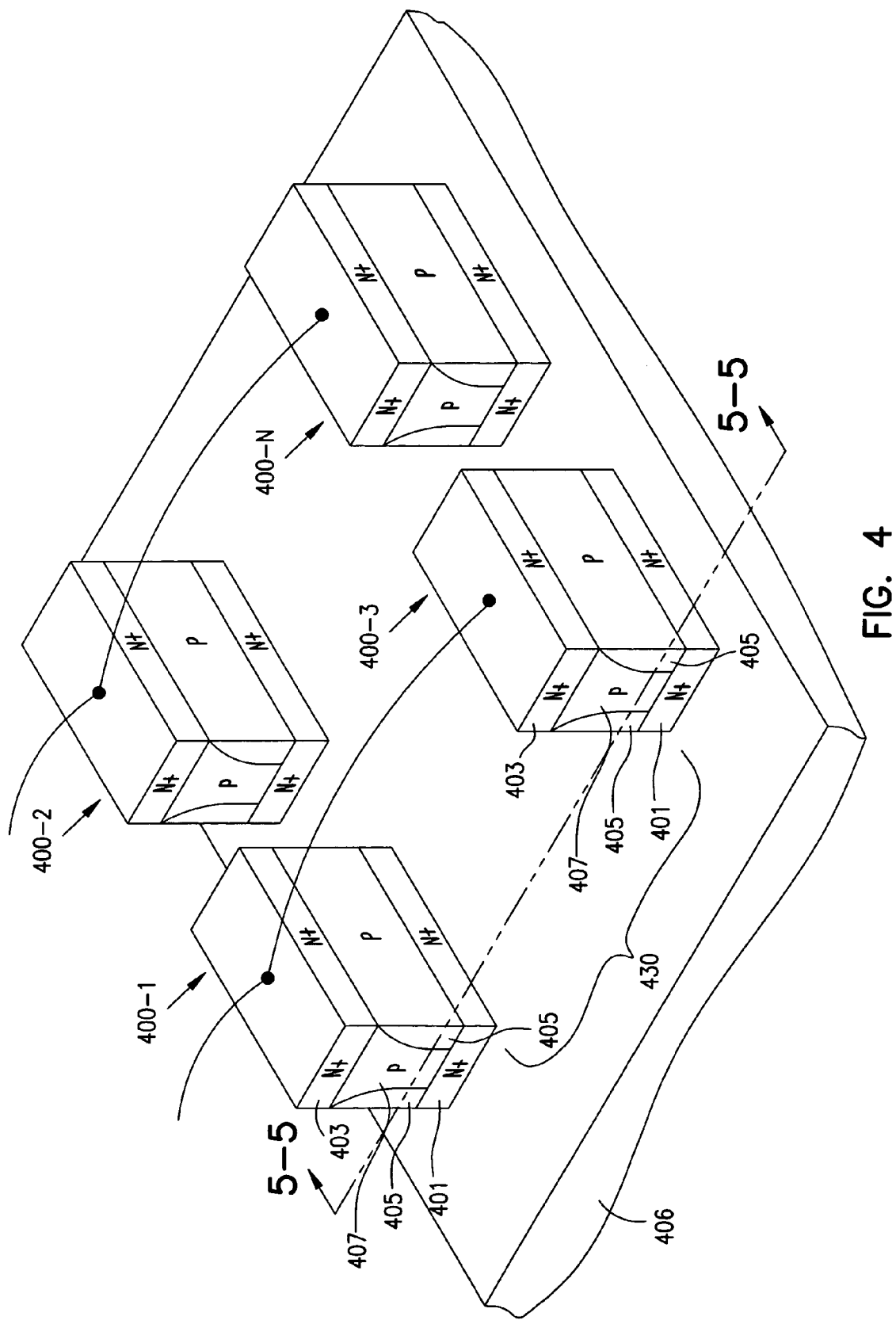
FIG. 4 is a perspective view illustrating an array of silicon pillars formed on a substrate as used in one embodiment according to the teachings of the present invention.

FIG. 4 is a perspective view illustrating an array of silicon pillars 400-1, 400-2, 400-3, . . . , 400-N, formed on a substrate 406 as used in one embodiment according to the teachings of the present invention. As will be understood by one of ordinary skill in the art upon reading this disclosure, the substrates can be (i) conventional p-type bulk silicon or p-type epitaxial layers on p+ wafers, (ii) silicon on insulator formed by conventional SIMOX, wafer bonding and etch back or silicon on sapphire, or (iii) small islands of silicon on insulator utilizing techniques such as described in more detail in U.S. Pat. No. 5,691,230, by Leonard Forbes, entitled "Technique for Producing Small Islands of Silicon on Insulator," issued Nov. 25, 1997, which is incorporated herein by reference.

As shown in FIG. 4, each pillar in the array of silicon pillars 400-1, 400-2, 400-3, . . . , 400-N, includes a first source/drain region 401 and a second source/drain region 403. The first and the second source/drain regions, 401 and 403, are separated by a body region 407 including channel regions 405. As shown in FIG. 4, a number of trenches 430 separate adjacent pillars in the array of silicon pillars 400-1, 400-2, 400-3, . . . , 400-N. Trenches 430 are referenced in connection with the discussion which follows in connection with FIGS. 5A-5E.

Figure 5A:
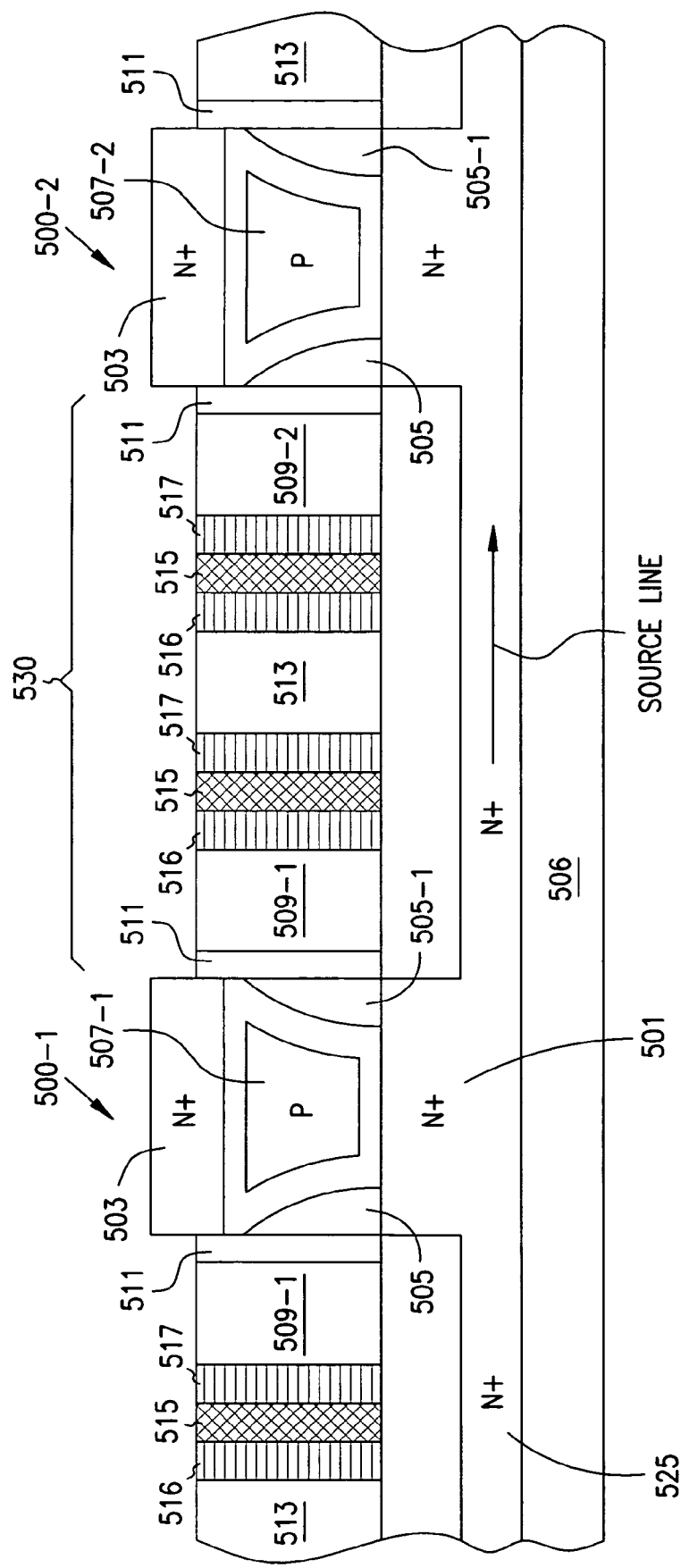

FIGS. 5A-5E are cross sectional views taken along cut line 5-5 from FIG. 4. As mentioned above in connection with FIG. 3, a number of floating gate and control gate configurations are included in the present invention. FIG. 5A illustrates one such embodiment of the present invention. FIG. 5A illustrates a first source/drain region 501 and second source/drain region 503 for a non-volatile memory cell 500 formed according to the teachings of the present invention. As shown in FIG. 5, the first and second source/drain regions, 501 and 503, are contained in a pillar of semiconductor material, and separated by a body region 507 including channel regions 505. As shown in the embodiments of FIGS. 5A-5E, the first source/drain region 501 is integrally connected to a buried sourceline 525. As one or ordinary skill in the art will understand upon reading this disclosure the buried sourceline 525 is be formed of semiconductor material which has the same doping type as the first source/drain region 501. In one embodiment, the sourceline 525 is formed of semiconductor material of the same doping as the first source/drain region 501, but is more heavily doped than the first source/drain region 501.

As shown in the embodiment of FIG. 5A, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In this embodiment, a single control gate 513 is shared by the pair of floating gates 509-1 and 509-2 on opposing sides of the trench 530. As one of ordinary skill in the art will understand upon reading this disclosure, the shared single control gate 513 can include an integrally formed control gate line. As shown in FIG. 5A, such an integrally formed control gate line 513 can be one of a plurality of control gate lines which are each independently formed in the trench, such as trench 530, below the top surface of the pillars 500-1 and 500-2 and between the pair of floating gates 509-1 and 509-2. In one embodiment, according to the teachings of the present invention, each floating gate, e.g. 509-1 and 509-2, includes a vertically oriented floating gate having a vertical length of less than 100 nanometers.

Figure 5B:
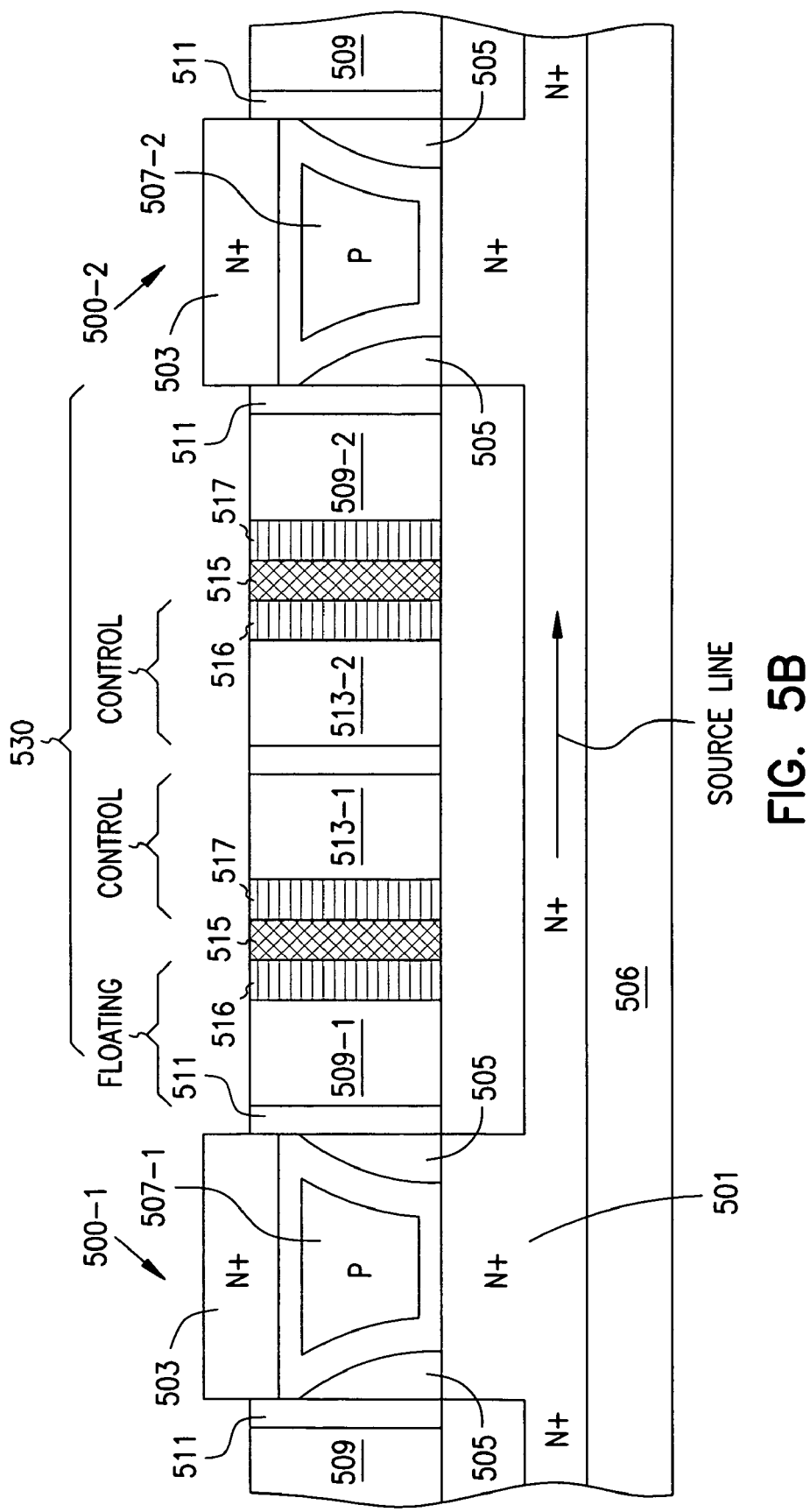

As shown in the embodiment of FIG. 5B, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5B, a plurality of control gate lines are again formed in trenches, e.g. trench 530, below the top surface of the pillars, 500-1 and 500-2, and between the pair of floating gates 509-1 and 509-2. However, in this embodiment, each trench, e.g. 530, houses a pair of control gate lines, shown as 513-1 and 513-2. Each one of the pair of control gate lines 513-1 and 513-2 addresses the floating gates, 509-1 and 509-2 respectively, on opposing sides of the trench 530. In this embodiment, the pair of control gate lines, or control gates 513-1 and 513-2 are separated by an insulator layer.

As shown in the embodiment of FIG. 5C, a pair of floating gates 509-1 and 509-2 are again formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5C, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. In the embodiment of FIG. 5C, each pair of floating gates, e.g. 509-1 and 509-2, in a given trench shares a single control gate line, or control gate 513.

Figure 5D:
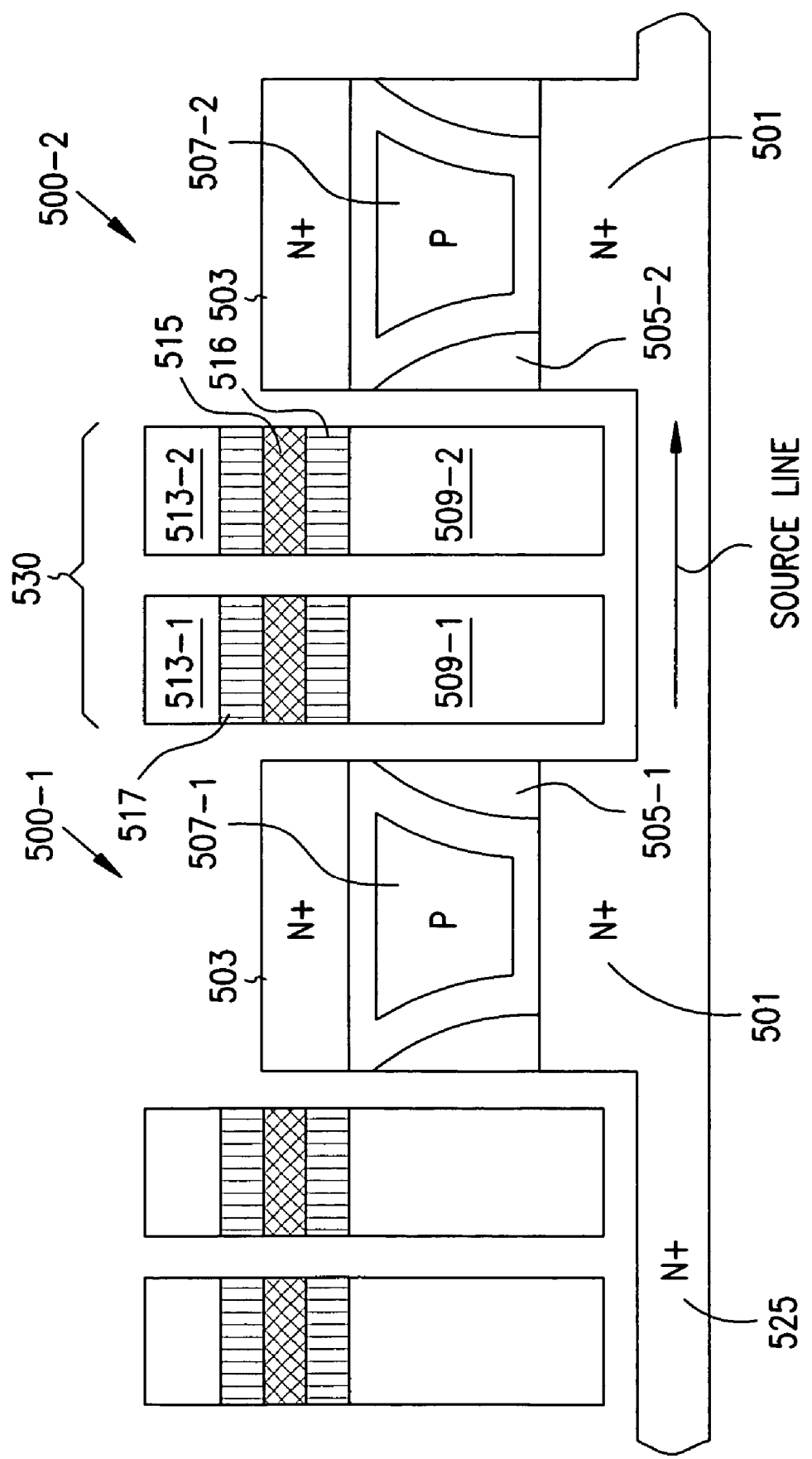

As shown in the embodiment of FIG. 5D, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5D, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. However, in the embodiment of FIG. 5D, each one of the pair of floating gates, e.g. 509-1 and 509-2, is addressed by an independent one of the plurality of control lines or control gates, shown in FIG. 5D as 513-1 and 513-2.

Figure 5E:
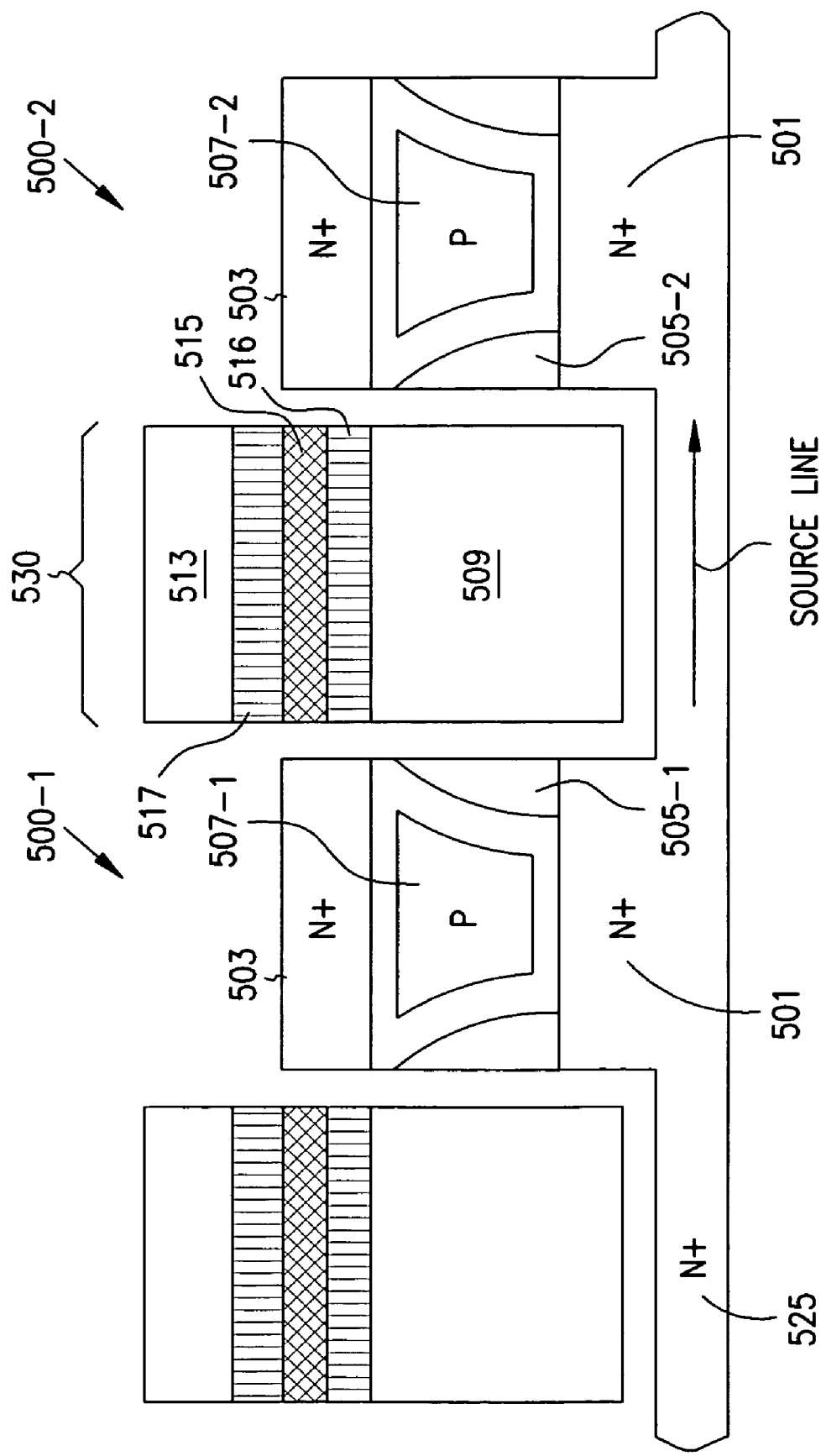

As shown in the embodiment of FIG. 5E, a single floating gate 509 is formed in each trench 530 between adjacent pillars which form memory cells 500-1 and 500-2. According to the teachings of the present invention, the single floating gate 509 can be either a vertically oriented floating gate 509 or a horizontally oriented floating gate 509 formed by conventional processing techniques, or can be a horizontally oriented floating gate 509 formed by a replacement gate technique such as described in a copending application, entitled "Flash Memory with Ultrathin Vertical Body Transistors," by Leonard Forbes and Kie Y. Ahn, application Ser. No. 09/780,169. In one embodiment of the present invention, the floating gate 509 has a vertical length facing the body region 505 of less than 100 nm. In another embodiment, the floating gate 509 has a vertical length facing the body region 505 of less than 50 nm. In one embodiment, as shown in FIG. 5E, the floating gate 509 is shared, respectively, with the body regions 507-1 and 507-2, including channel regions 505-1 and 505-2, in adjacent pillars 500-1 and 500-2 located on opposing sides of the trench 530.

As one of ordinary skill in the art will understand upon reading this disclosure, in each of the embodiments described above in connection with FIGS. 5A-5E the floating gates 509 are separated from the control gate lines, or control gates 513 with a low tunnel barrier intergate insulator in accordance with the descriptions given above in connection with FIG. 3. The modifications here are to use tunneling through the inter-poly dielectric to realize flash memory devices. The vertical devices include an extra flexibility in that the capacitors, e.g. gate oxide and intergate insulator, are easily fabricated with different areas. This readily allows the use of very high dielectric constant inter-poly dielectric insulators with lower tunneling barriers.

Figure 6A:
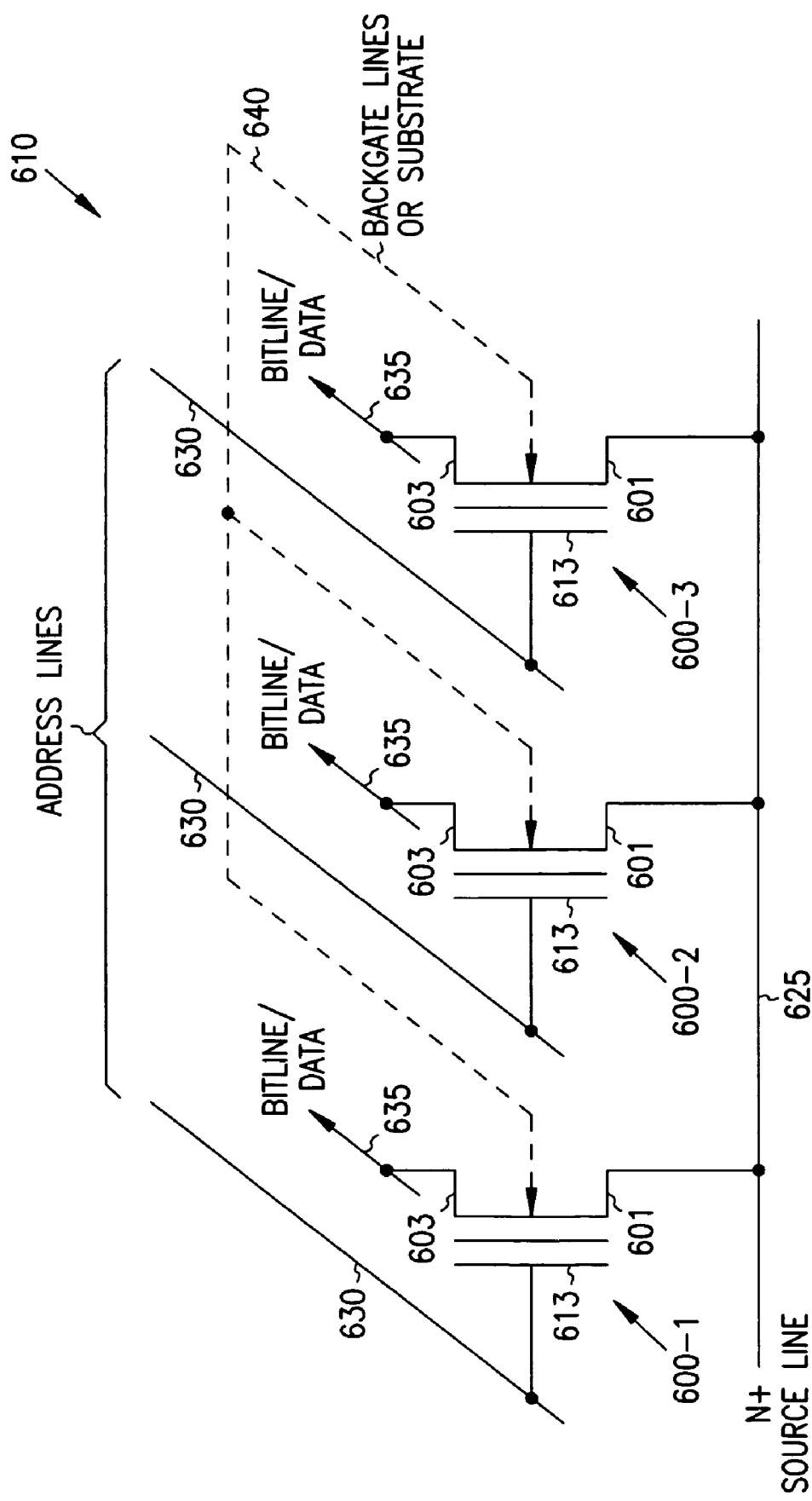
FIGS. 6A-6D illustrate a number of address coincidence schemes can be used together with the present invention.

FIGS. 6A-6D illustrate that a number of address coincidence schemes can be used together with the present invention. FIG. 6A illustrates a NOR flash memory array 610 having a number of non-volatile memory cells 600-1, 600-2, 600-3, using a coincidence address array scheme. For purposes of illustration, FIG. 6A shows a sourceline 625 coupled to a first source/drain region 601 in each of the number of non-volatile memory cells 600-1, 600-2, 600-3. The sourceline is shown oriented in a first selected direction in the flash memory array 610. In FIG. 6A, a number of control gate lines 630 are shown oriented in a second selected direction in the flash memory array 610. As shown in FIG. 6A, the number of control gate lines 630 are coupled to, or integrally formed with the control gates 613 for the number of non-volatile memory cells 600-1, 600-2, 600-3. As shown in FIG. 6A, the second selected direction is orthogonal to the first selected direction. Finally, FIG. 6A shows a number of bitlines 635 oriented in a third selected direction in the flash memory array 610. As shown in FIG. 6A, the number of bitlines are coupled to the second source/drain regions in the number of non-volatile memory cells 600-1, 600-2, 600-3. In the embodiment shown in FIG. 6A the third selected direction is parallel to the second selected direction and the number of control gate lines 630 serve as address lines. Also, as shown in FIG. 6A, the flash memory array 610 includes a number of backgate or substrate/well bias address lines 640 coupled to the substrate.

Figure 6B:
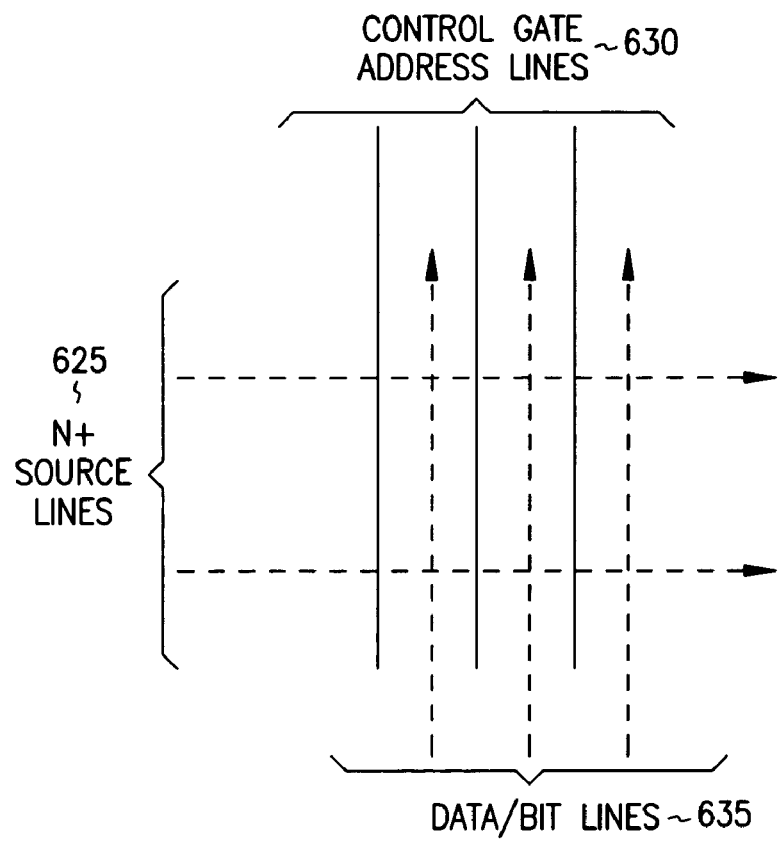
Figure 6C:
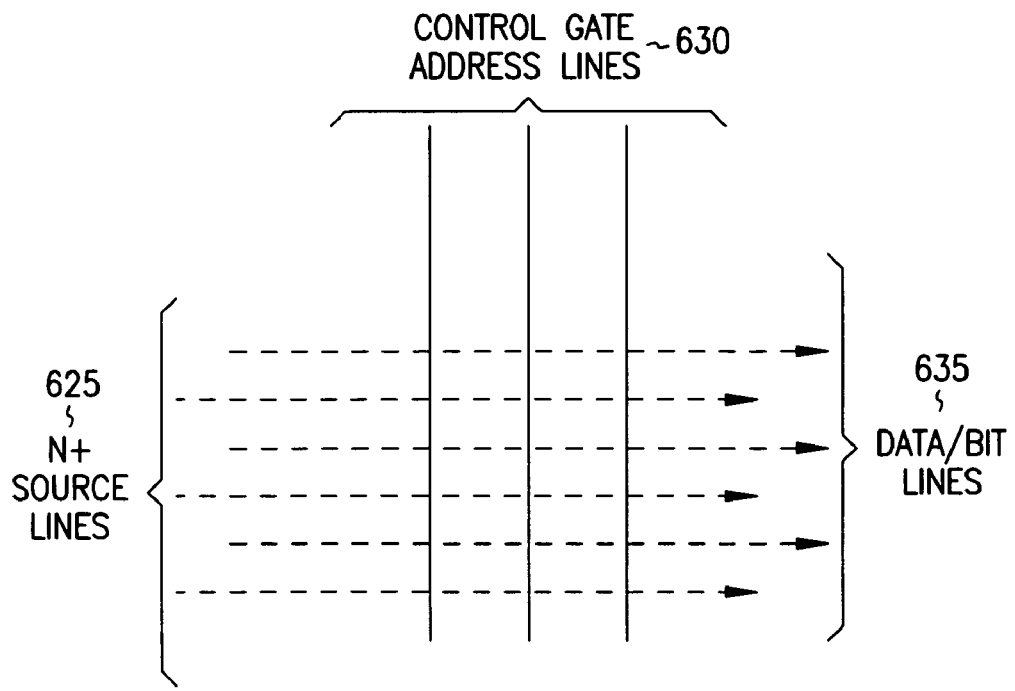
Figure 6D:
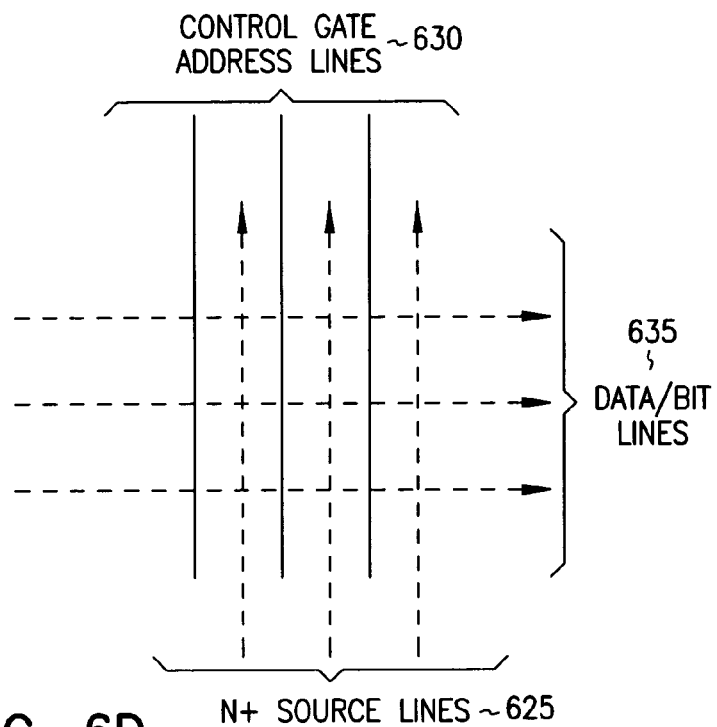

Using FIG. 6A as a reference point, FIGS. 6B-6D illustrate of top view for three different coincidence address scheme layouts suitable for use with the present invention. First, FIG. 6B provides the top view layout of the coincidence address scheme described in connection with FIG. 6A. That is, FIG. 6B illustrates a number of sourcelines 625 oriented in a first selected direction, a number of control gate lines 630 oriented in a second selected direction, and a number of bitlines 635 oriented in a third selected direction for the flash memory array 600. As explained above in connection with FIG. 6A, in this embodiment, the second and third selected direction are parallel to one another and orthogonal to the first selected direction such that the number of control gate lines 630 serve as address lines.

FIG. 6C provides the top view layout of another coincidence address scheme according to the teachings of the present invention. This is, FIG. 6C illustrates a number of sourcelines 625 oriented in a first selected direction, a number of control gate lines 630 oriented in a second selected direction, and a number of bitlines 635 oriented in a third selected direction for the flash memory array 600. In the embodiment of FIG. 6C, the first selected direction and the third selected direction are parallel to one another and orthogonal to the second selected direction. In this embodiment, the number of control gate lines 630 again serve as address lines.

FIG. 6D provides the top view layout of yet another coincidence address scheme according to the teachings of the present invention. This is, FIG. 6D illustrates a number of sourcelines 625 oriented in a first selected direction, a number of control gate lines 630 oriented in a second selected direction, and a number of bitlines 635 oriented in a third selected direction for the flash memory array 600. In the embodiment of FIG. 6D, the first selected direction and the second selected direction are parallel to one another and orthogonal to the third selected direction. In this embodiment, the number of bitlines 635 serve as address lines.

As will be apparent to one of ordinary skill in the art upon reading this disclosure, and as will be described in more detail below, write can still be achieved by hot electron injection and/or, according to the teachings of the present invention, tunneling from the control gate. According to the teachings of the present invention, block erase is accomplished by driving the control gates with a relatively large positive voltage and tunneling from the metal on top of the floating gate to the metal on the bottom of the control gate.

Figure 7A:
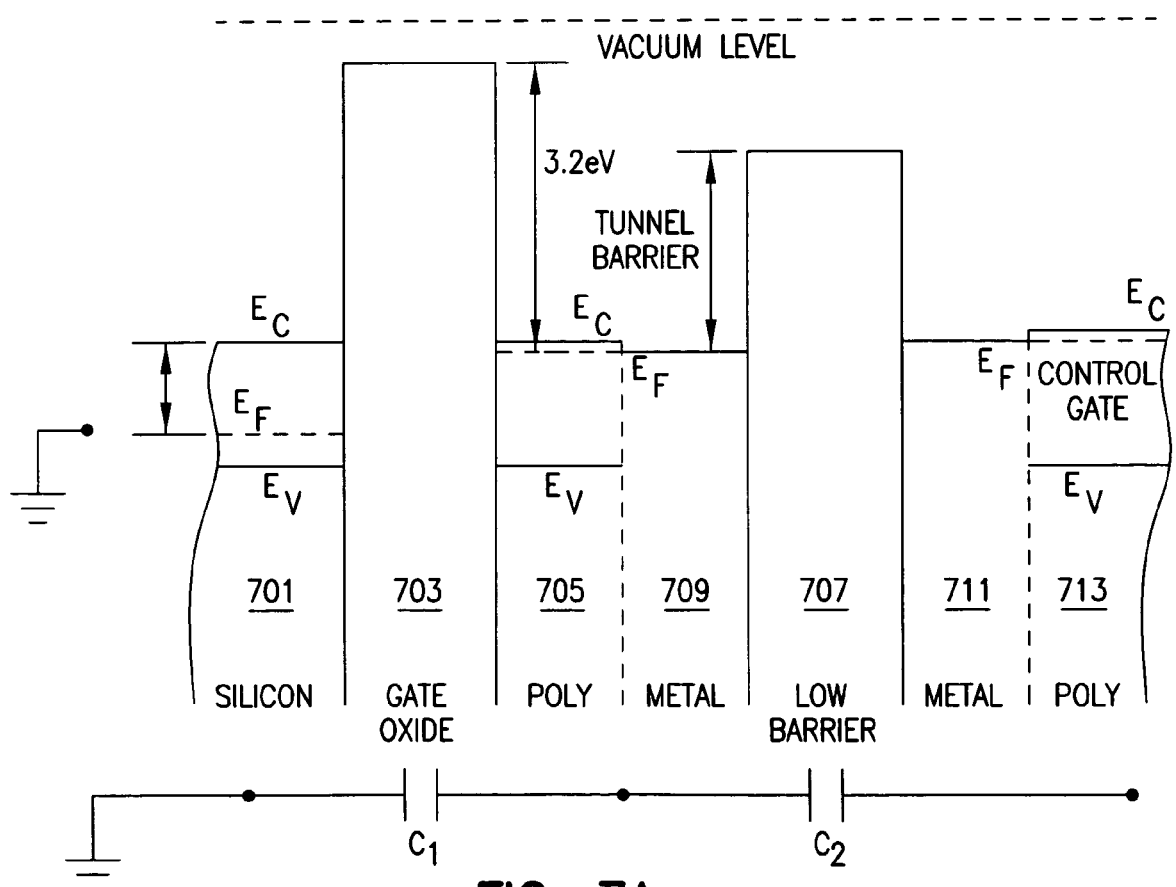
FIG. 7A is an energy band diagram illustrating the band structure at vacuum level with the low tunnel barrier interpoly insulator according to the teachings of the present invention.

FIG. 7A is an energy band diagram illustrating the band structure at vacuum level with the low tunnel barrier interpoly insulator according to the teachings of the present invention. FIG. 7A is useful in illustrating the reduced tunnel barrier off of the floating gate to the control gate and for illustrating the respective capacitances of the structure according to the teachings of the present invention.

FIG. 7A shows the band structure of the silicon substrate, e.g. channel region 701, silicon dioxide gate insulator, e.g. gate oxide 703, polysilicon floating gate 705, the low tunnel barrier interpoly dielectric 707, between metal plates 709 and 711, and then the polysilicon control gate 713, according to the teachings of the present invention.

The design considerations involved are determined by the dielectric constant, thickness and tunneling barrier height of the interpoly dielectric insulator 707 relative to that of the silicon dioxide gate insulator, e.g. gate oxide 703. The tunneling probability through the interpoly dielectric 707 is an exponential function of both the barrier height and the electric field across this dielectric.

Figure 7B:
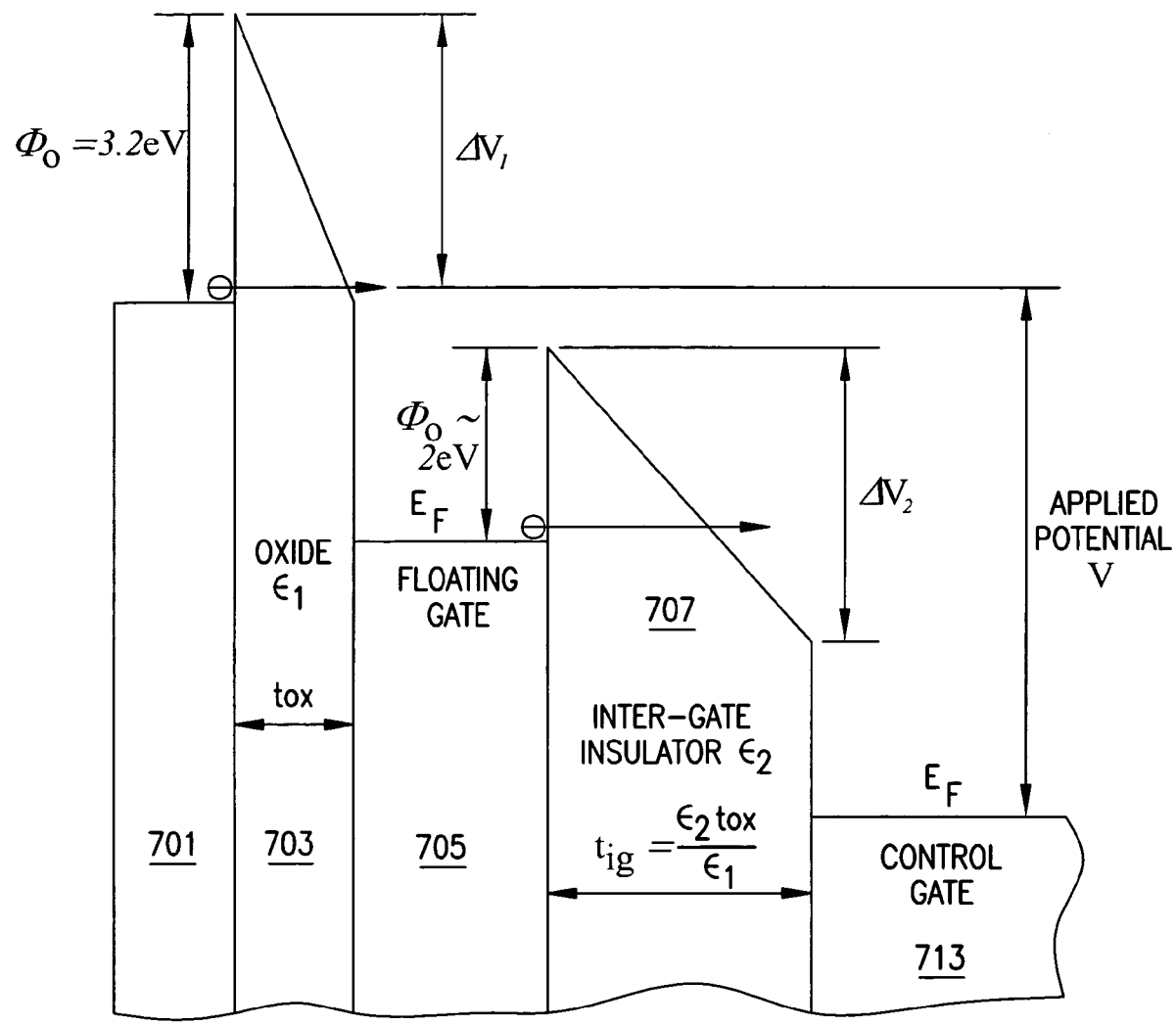
FIG. 7B is an energy band diagram illustrating the band structure during an erase operation of electrons from the floating gate to the control gate across the low tunnel barrier interpoly insulator according to the teachings of the present invention.

FIG. 7B is an energy band diagram illustrating the band structure during an erase operation of electrons from the floating gate 705 to the control gate 713 across the low tunnel barrier interpoly insulator 707 according to the teachings of the present invention. FIG. 7B is similarly useful in illustrating the reduced tunnel barrier off of the floating gate 705 to the control gate 713 and for illustrating the respective capacitances of the structure according to the teachings of the present invention.

As shown in FIG. 7B, the electric field is determined by the total voltage difference across the structure, the ratio of the capacitances (see FIG. 7A), and the thickness of the interpoly dielectric 707. The voltage across the interpoly dielectric 707 will be, $\Delta V2 = V\, C1/(C1+C2)$, where V is the total applied voltage. The capacitances, C, of the structures depends on the dielectric constant, $\in_r$, or the permittivity of free space, $\in_o$, and the thickness of the insulating layers, t, and area, A, such that $C = \in_r \in_o A/t$, Farads/cm$^2$. The electric field across the interpoly dielectric insulator 707, having capacitance, C2, will then be E2=$\Delta V2/t2$, where t2 is the thickness of this layer.

The tunneling current in erasing charge from the floating gate 705 by tunneling to the control gate 713 will then be as shown in FIG. 7B given by an equation of the form:

$$J = B\exp(-Eo/E)$$

where E is the electric field across the interpoly dielectric insulator 707 and Eo depends on the barrier height. Practical values of current densities for aluminum oxide which has a current density of 1 A/cm$^2$ at a field of about E=1V/20 A=5× 10$^{+6}$ V/cm are evidenced in a description by Pollack. (See generally, S. R. Pollack and C. E. Morris, "Tunneling through gaseous oxidized films of Al$_2$O$_3$," Trans. AIME, Vol. 233, p. 497, 1965). Practical current densities for silicon oxide transistor gate insulators which has a current density of 1 A/cm$^2$ at a field of about E=2.3V/23A=1×10$^{+7}$ V/cm are evidenced in a description by T. P. Ma et al. (See generally, T. P. Ma et al., "Tunneling leakage current in ultrathin (<a4 nm) nitride/oxide stack dielectrics," IEEE Electron Device Letters, vol. 19, no. 10, pp. 388-390, 1998).

The lower electric field in the aluminum oxide interpoly insulator 707 for the same current density reflects the lower tunneling barrier of less than 2 eV, shown in FIG. 7B, as opposed to the 3.2 eV tunneling barrier of silicon oxide 703, also illustrated in FIG. 7B.

Figure 7C:
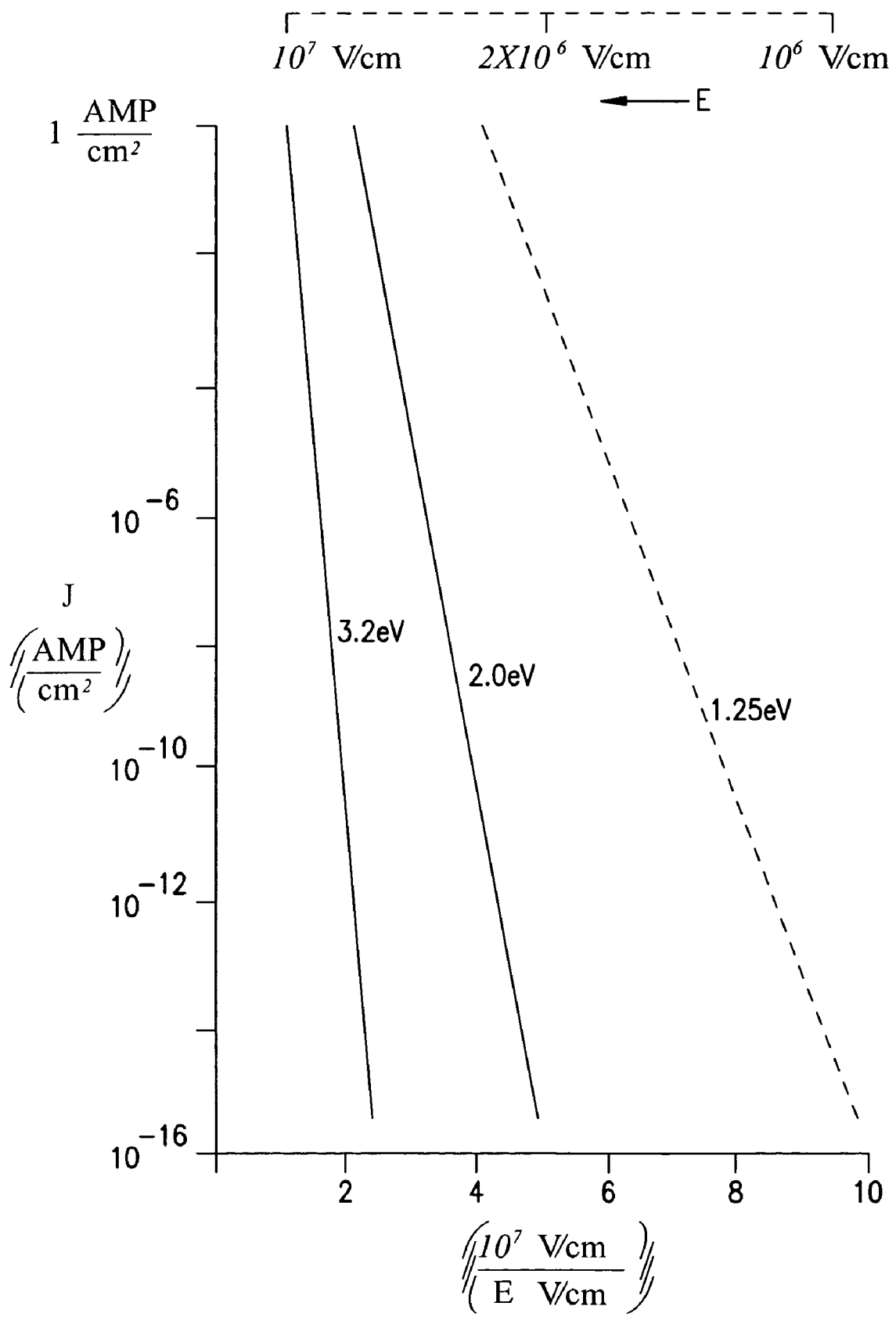
FIG. 7C is a graph plotting tunneling currents versus the applied electric fields (reciprocal applied electric field shown) for an number of barrier heights.

FIG. 7C is a graph plotting tunneling currents versus the applied electric fields (reciprocal applied electric field shown) for a number of barrier heights. FIG. 7C illustrates the dependence of the tunneling currents on electric field (reciprocal applied electric field) and barrier height. The fraction of voltage across the interpoly or intergate insulator, $\Delta V2$, can be increased by making the area of the intergate capacitor, C2, (e.g. intergate insulator 707) smaller than the area of the transistor gate capacitor, C1 (e.g. gate oxide 703). This would be required with high dielectric constant intergate dielectric insulators 707 and is easily realized with the vertical floating gate structures described above in connection with FIGS. 3, and 5A-5E.

Methods of Formation

Several examples are outlined below in order to illustrate how a diversity of such metal oxide tunnel barriers can be formed, according to the teachings of the present invention. Processing details and precise pathways taken which are not expressly set forth below will be obvious to one of ordinary skill in the art upon reading this disclosure. Firstly, although not included in the details below, it is important also to take into account the following processing factors in connection with the present invention:

(i) The poly-Si layer is to be formed with emphasis on obtaining a surface that is very smooth and morphologically stable at subsequent device processing temperatures which will exceed that used to grow Metal oxide.

(ii) The native SiO$_x$ oxide on the poly-Si surface must be removed (e.g., by sputter cleaning in an inert gas plasma in situ) just prior to depositing the metal film. The electrical characteristics of the resultant Poly-Si/Metal/Metal oxide/Metal/Poly-Si structure will be better defined and reproducible than that of a Poly-Si/Native SiO$_x$/Metal/Metal oxide/Poly-Si structure.

(iii) The oxide growth rate and limiting thickness will increase with oxidation temperature and oxygen pressure. The oxidation kinetics of a metal may, in some cases, depend on the crystallographic orientations of the very small grains of metal which comprise the metal film (see generally, O, Kubaschewski and B. E. Hopkins, "Oxidation of Metals and Alloys", Butterworth, London, pp. 53-64, 1962). If such effects are significant, the metal deposition process can be modified in order to increase its preferred orientation and subsequent oxide thickness and tunneling uniformity. To this end, use can be made of the fact that metal films strongly prefer to grow during their depositions having their lowest free energy planes parallel to the film surface. This preference varies with the crystal structure of the metal. For example, fcc metals prefer to form {111} surface plans. Metal orientation effects, if present, would be larger when only a limited fraction of the metal will be oxidized and unimportant when all or most of the metal is oxidized.

(iv) Modifications in the structure shown in FIG. 2 may be introduced in order to compensate for certain properties in some metal/oxide/metal layers. Such changes are reasonable since a wide range of metals, alloys and oxides with quite different physical and chemical properties can be used to form these tunnel junctions.

EXAMPLE I

Formation of PbO Tunnel Barriers

This oxide barrier has been studied in detail using Pb/PbO/Pb structures. The oxide itself can be grown very controllably on deposited lead films using either thermal oxidation (see generally, J. M. Eldridge and J. Matisoo, "Measurement of tunnel current density in a Meal-Oxide-Metal system as a function of oxide thickness," Proc. $12^{th}$ Intern. Conf. on Low Temperature Physics, pp. 427-428, 1971; J. M. Eldridge and D. W. Dong, "Growth of thin PbO layers on lead films. I. Experiment," Surface Science, Vol. 40, pp. 512-530, 1973) or rf sputter etching in an oxygen plasma (see generally, J. H. Greiner, "Oxidation of lead films by rf sputter etching in an oxygen plasma", J. Appl. Phys., Vol. 45, No. 1, pp. 32-37, 1974). It will be seen that there are a number of possible variations on this structure. Starting with a clean poly-Si substrate, one processing sequence using thermal oxidation involves:

(i) Depositing a clean lead film on the poly-Si floating gate at ~25 to 75 C in a clean vacuum system having a base pressure of ~$10^{-8}$ Torr or lower. The Pb film will be very thin with a thickness within 1 or 2 A of its target value.

(ii) Lead and other metal films can be deposited by various means including physical sputtering and/or from a Knudsen evaporation cell. The sputtering process also offers the ability to produce smoother films by increasing the re-sputtering-to-deposition ratio since re-sputtering preferentially reduces geometric high points of the film.

Figure 1A:
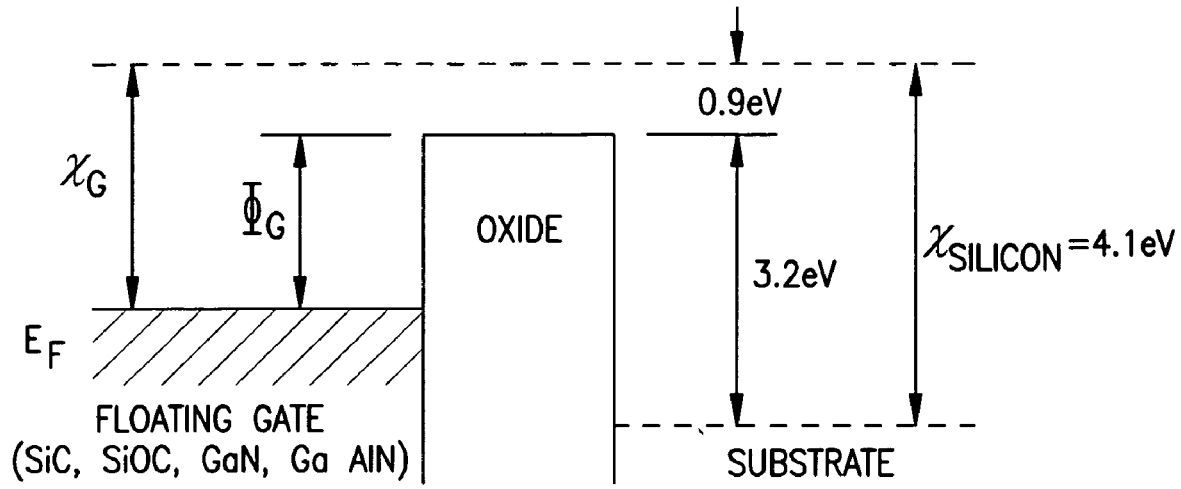
FIGS. 1A-1C illustrate a number of previous methods for reducing tunneling barriers in Flash memory.
Figure 1B:
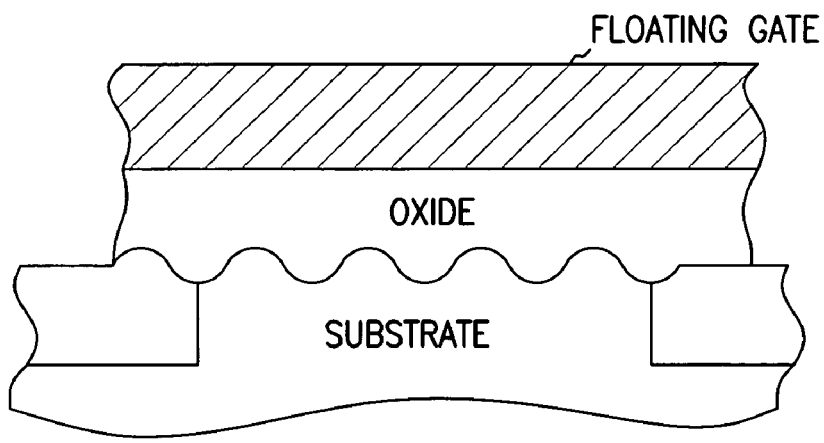
Figure 1C:
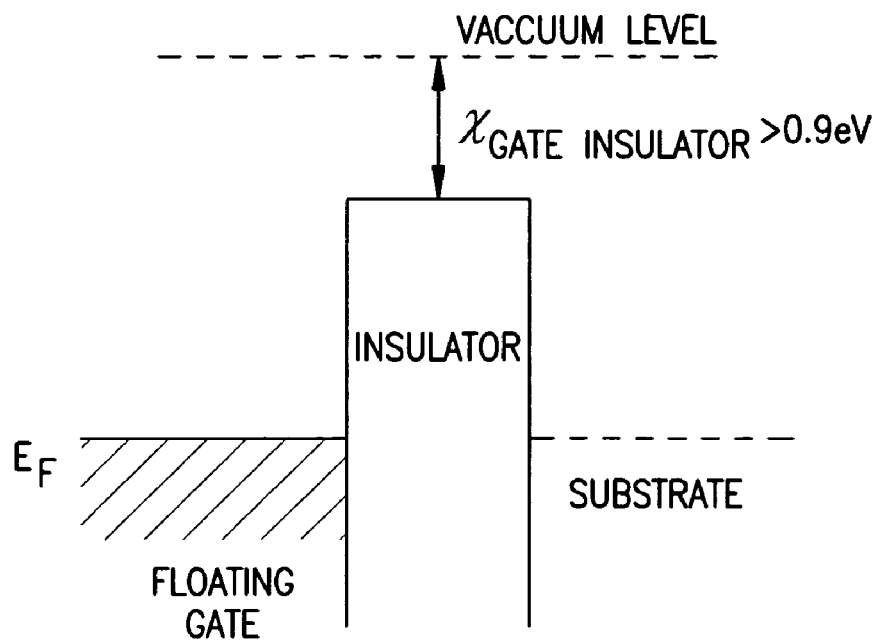

(iii) Using a "low temperature oxidation process" to grow an oxide film of self-limited thickness. In this case, oxygen gas is introduced at the desired pressure in order to oxidize the lead in situ without an intervening exposure to ambient air. For a fixed oxygen pressure and temperature, the PbO thickness increases with log(time). Its thickness can be controlled via time or other parameters to within 0.10 A, as determined via in situ ellipsometric or ex situ measurements of Josephson tunneling currents. This control is demonstrated by the very limited statistical scatter of the current PbO thickness data shown in the insert of FIG. 3 in an article by J. M. Eldridge and J. Matisoo, entitled "Measurement of tunnel current density in a Meal-Oxide-Metal system as a function of oxide thickness," Proc. $12^{th}$ Intern. Conf. on Low Temperature Physics, pp. 427-428, 1971. This remarkable degree of control over tunnel current is due to the excellent control over PbO thickness that can be achieved by "low temperature oxidation." For example, increasing the oxidation time from 100 to 1,000 minutes at an oxygen pressure of 750 Torr at 25 C only raises the PbO thickness by 3 A (e.g., from ~21 to 24 A, see FIG. 1 in J. M. Eldridge and J. Matisoo, "Measurement of tunnel current density in a Meal-Oxide-Metal system as a function of oxide thickness," Proc. $12^{th}$ Intern. Conf. on Low Temperature Physics, pp. 427-428, 1971). Accordingly, controlling the oxidation time to within 1 out of a nominal 100 minute total oxidation time provides a thickness that is within 0.1 A of 21 A. The PbO has a highly stoichiometric composition throughout its thickness, as evidenced from ellipsometry (e.g., see FIG. 6 in J. M. Eldridge and D. W. Dong, "Growth of thin PbO layers on lead films. I. Experiment," Surface Science, Vol. 40, pp. 512-530, 1973) and the fact that the tunnel barrier heights are identical for Pb/PbO/Pb structures.

(iv) Re-evacuate the system and deposit the top lead electrode. This produces a tunnel structure having virtually identical tunnel barriers at both Pb/O interfaces.

(v) The temperature used to subsequently deposit the Poly-Si control gate must be held below the melting temperature (327 C) of lead. The PbO itself is stable (up to ~500 C or higher) and thus introduces no temperature constraint on subsequent processes. One may optionally oxidize the lead film to completion, thereby circumventing the low melting temperature of metallic lead. In this case, one would form a Poly-Si/PbO/Poly-Si tunnel structure having an altered tunnel barrier for charge injection. Yet another variation out of several would involve: oxidizing the lead film to completion; replacing the top lead electrode with a higher melting metal such as Al; and, then adding the poly-Si control layer. This junction would have asymmetrical tunneling behavior due to the difference in barrier heights between the Pb/PbO and PbO/Al electrodes.

EXAMPLE II

Formation of $Al_2O_3$ Tunnel Barriers

A number of studies have dealt with electron tunneling in Al/$Al_2O_3$/Al structures where the oxide was grown by "low temperature oxidation" in either molecular or plasma oxygen (see generally, S. M. Sze, Physics of Semiconductor Devices, Wiley, NY, pp. 553-556, 1981; G. Simmons and A. El-Badry, "Generalized formula for the electric tunnel effect between similar electrodes separated by a thin insulating film," J. Appl. Phys., Vol. 34, p. 1793, 1963; S. R. Pollack and C. E. Morris, "Tunneling through gaseous oxidized films of $Al_2O_3$," Trans. AIME, Vol. 233, p. 497, 1965; Z. Hurych, "Influence of nonuniform thickness of dielectric layers on capacitance and tunnel currents," Solid-State Electronics, Vol. 9, p. 967, 1966; S. P. S. Arya and H. P. Singh, "Conduction properties of thin $Al_2O_3$ films," Thin Solid Films, Vol. 91, No. 4, pp. 363-374, May 1982; K.-H. Gundlach and J. Holzl, "Logarithmic conductivity of Al—$Al_2O_3$—Al tunneling junctions produced by plasma- and by thermal-oxidation", surface Science, Vol. 27, pp. 125-141, 1971). Before sketching out a processing sequence for these tunnel barriers, note:

(i) Capacitance and tunnel measurements indicate that the $Al_2O_3$ thickness increases with the log (oxidation time), similar to that found for PbO/Pb as well as a great many other oxide/metal systems.

(ii) Tunnel currents are asymmetrical in this system with somewhat larger currents flowing when electrons are injected from Al/Al$_2$O$_3$ interface developed during oxide growth. This asymmetry is due to a minor change in composition of the growing oxide: there is a small concentration of excess metal in the Al$_2$O$_3$, the concentration of which diminishes as the oxide is grown thicker. The excess Al$^{+3}$ ions produce a space charge that lowers the tunnel barrier at the inner interface. The oxide composition at the outer Al$_2$O$_3$/Al contact is much more stoichiometric and thus has a higher tunnel barrier. In situ ellipsometer measurements on the thermal oxidation of Al films deposited and oxidized in situ support this model (see generally, J. Grimblot and J. M. Eldridge, "I. Interaction of Al films with O$_2$ at low pressures", J. Electro. Chem. Soc., Vol. 129, No. 10, pp. 2366-2368, 1982. J. Grimblot and J. M. Eldridge, "II. Oxidation of Al films", ibid, 2369-2372, 1982). In spite of this minor complication, Al/Al$_2$O$_3$/Al tunnel barriers can be formed that will produce predictable and highly controllable tunnel currents that can be ejected from either electrode. The magnitude of the currents are still primarily dominated by Al$_2$O$_3$ thickness which can be controlled via the oxidation parametrics.

With this background, we can proceed to outline one process path out of several that can be used to form Al$_2$O$_3$ tunnel barriers. Here the aluminum is thermally oxidized although one could use other techniques such as plasma oxidation (see generally, S. R. Pollack and C. E. Morris, "Tunneling through gaseous oxidized films of Al$_2$O$_3$," Trans. AIME, Vol. 233, p. 497, 1965; K.-H. Gundlach and J. Holzl, "Logarithmic conductivity of Al—Al$_2$O$_3$—Al tunneling junctions produced by plasma- and by thermal-oxidation", Surface Science, Vol. 27, pp. 125-141, 1971) or rf sputtering in an oxygen plasma (see generally, J. H. Greiner, "Oxidation of lead films by rf sputter etching in an oxygen plasma", J. Appl. Phys., Vol. 45, No. 1, pp. 32-37, 1974). For the sake of brevity, some details noted above will not be repeated. The formation of the Al/Al$_2$O$_3$/Al structures will be seen to be simpler than that described for the Pb/PbO/Pb junctions owing to the much higher melting point of aluminum, relative to lead.

(i) Sputter deposit aluminum on poly-Si at a temperature of ~25 to 150 C. Due to thermodynamic forces, the microcrystallites of the f.c.c. aluminum will have a strong and desirable (111) preferred orientation.

(ii) Oxidize the aluminum in situ in molecular oxygen using temperatures, pressure and time to obtain the desired Al$_2$O$_3$ thickness. As with PbO, the thickness increases with log (time) and can be controlled via time at a fixed oxygen pressure and temperature to within 0.10 Angstroms, when averaged over a large number of aluminum grains that are present under the counter-electrode. One can readily change the Al$_2$O$_3$ thickness from ~15 to 35 A by using appropriate oxidation parametrics (e.g., see FIG. 2 in J. Grimblot and J. M. Eldridge, "II. Oxidation of Al films", J. Electro. Chem. Soc., Vol. 129, No. 10, pp. 2369-2372, 1982). The oxide will be amorphous and remain so until temperatures in excess of 400 C are reached. The initiation of recrystallization and grain growth can be suppressed, if desired, via the addition of small amounts of glass forming elements (e.g., Si) without altering the growth kinetics or barrier heights significantly.

(iii) Re-evaluate the system and deposit a second layer of aluminum.

(iv) Deposit the Poly-Si control gate layer using conventional processes.

EXAMPLE III

Formation of Single- and Multi-Layer Transition Metal Oxide Tunnel Barriers

Single layers of Ta$_2$O$_5$, TiO$_2$, ZrO$_2$, Nb$_2$O$_5$ and similar transition metal oxides can be formed by "low temperature oxidation" of numerous Transition Metal (e.g., TM oxides) films in molecular and plasma oxygen and also by rf sputtering in an oxygen plasma. The thermal oxidation kinetics of these metals have been studied for decades with numerous descriptions and references to be found in the book by Kubaschewski and Hopkins (O. Kubaschewski and B. E. Hopkins, "Oxidation of Metals and Alloys", Butterworth, London, pp. 53-64, 1962). In essence, such metals oxidize via logarithmic kinetics to reach thicknesses of a few to several tens of angstroms in the range of 100 to 300 C. Excellent oxide barriers for Josephson tunnel devices can be formed by rf sputter etching these metals in an oxygen plasma (see generally, J. M. Greiner, "Josephson tunneling barriers by rf sputter etching in an oxygen plasma," J. Appl. Phys., Vol. 42, No. 12, pp. 5151-5155, 1971; O. Michikami et al., "Method of fabrication of Josephson tunnel junctions," U.S. Pat. No. 4,412,902, Nov. 1, 1983). Such "low temperature oxidation" approaches differ considerably from MOCVD processes used to produce these TM oxides. MOCVD films require high temperature oxidation treatments to remove carbon impurities, improve oxide stoichiometry and produce recrystallization. Such high temperature treatments also cause unwanted interactions between the oxide and the underlying silicon and thus have necessitated the introduction of interfacial barrier layers. See, for example, H. F. Luan et al., "High quality Ta$_2$O$_5$ gate dielectrics with $T_{ox,eq}$<10 angstroms," IEDM Tech. Digest, pp. 141-144, 1999.

A new approach was described in a copending application by J. M. Eldridge, entitled "Thin Dielectric Films for DRAM Storage Capacitors," patent application Ser. No. 09/651,380 filed Aug. 29, 2000 that utilizes "low temperature oxidation" to form duplex layers of TM oxides. Unlike MOCVD films, the oxides are very pure and stoichiometric as formed. They do require at least a brief high temperature (est. 700 to 800 C but may be lower) treatment to transform their microstructures from amorphous to crystalline and thus increase their dielectric constants to the desired values (>20 or so). Unlike MOCVD oxides, this treatment can be carried out in an inert gas atmosphere, thus lessening the possibility of inadvertently oxidizing the poly-Si floating gate. While this earlier disclosure was directed at developing methods and procedures for producing high dielectric constant films for storage cells for DRAMs, the same teachings can be applied to producing thinner metal oxide tunnel films for the flash memory devices described in this disclosure. The dielectric constants of these TM oxides are substantially greater (>25 to 30 or more) than those of PbO and Al$_2$O$_3$. Duplex layers of these high dielectric constant oxide films are easily fabricated with simple tools and also provide improvement in device yields and reliability. Each oxide layer will contain some level of defects but the probability that such defects will overlap is exceedingly small. Effects of such duplex layers were first reported by one J. M. Eldridge of the present authors and are well known to practitioners of the art. It is worth mentioning that highly reproducible TM oxide tunnel barriers can be grown by rf sputtering in an oxygen ambient, as referenced above (see generally, J. M. Greiner, "Josephson tunneling barriers by rf sputter etching in an oxygen plasma," J. Appl. Phys., Vol. 42, No. 12, pp. 5151-5155, 1971; O. Michikami et al., "Method of fabrication of Josephson tunnel junctions," U.S. Pat. No. 4,412,902, Nov. 1, 1983). Control over oxide thickness and other properties in these studies were all the more remarkable in view of the fact that the oxides were typically grown on thick (e.g., 5,000 A) metals such as Nb and Ta. In such metal-oxide systems, a range of layers and sub-oxides can also form, each having their own properties. In the present disclosure, control over the properties of the various TM oxides will be even better since we employ very limited (perhaps 10 to 100 A or so) thicknesses of metal and thereby preclude the formation of significant quantities of unwanted, less controllable sub-oxide films. Thermodynamic forces will drive the oxide compositions to their most stable, fully oxidized state, e.g., $Nb_2O_5$, $Ta_2O_5$, etc. As noted above, it will still be necessary to crystallize these duplex oxide layers. Such treatments can be done by RTP and will be shorter than those used on MOCVD and sputter-deposited oxides since the stoichiometry and purity of the "low temperature oxides" need not be adjusted at high temperature.

Fairly detailed descriptions for producing thicker duplex layers of TM oxides have been given in the copending application by J. M. Eldridge, entitled "Thin Dielectric Films for DRAM Storage Capacitors," patent application Ser. No. 09/651,380 filed Aug. 29, 2000, so there is no need to repeat them here. Although perhaps obvious to those skilled in the art, one can sketch out a few useful fabrication guides:

(i) Thinner TM layers will be used in this invention relative to those used to form DRAMs. Unlike DRAMs where leakage must be eliminated, the duplex oxides used here must be thin enough to carry very controlled levels of current flow when subjected to reasonable applied fields and times.

(ii) The TM and their oxides are highly refractory and etchable (e.g., by RIE). Hence they are quite compatible with poly-Si control gate processes and other subsequent steps.

(iii) TM silicide formation will not occur during the oxidation step. It could take place at a significant rate at the temperatures used to deposit the poly-Si control gate. If so, several solutions can be applied including:

(i) Insert certain metals at the TM/poly-Si boundaries that will prevent inter-diffusion of the TM and the poly-Si.
  (ii) Completely oxide the TMs. The electrical characteristics of the resulting poly-Si/TM oxide 1/TM oxide 2/poly-Si structure will be different in the absence of having TM at the oxide/metal interfaces.

EXAMPLE IV

Formation of Alternate Metal Compound Tunnel Barriers

Although no applications may be immediately obvious, it is conceivable that one might want to form a stack of oxide films having quite different properties, for example, a stack comprised of a high dielectric constant (k) oxide/a low k oxide/a high k oxide. "Low temperature oxidation" can be used to form numerous variations of such structures. While most of this disclosure deals with the formation and use of stacks of oxide dielectrics, it is also possible to use "low temperature oxidation" to form other thin film dielectrics such as nitrides, oxynitrides, etc. that could provide additional functions such as being altered by monochromatic light, etc. These will not be discussed further here.

EXAMPLE V

Formation of Perovskite Oxide Tunnel Barriers

Some results have been obtained which demonstrate that at least a limited range of high temperature, super-conducting oxide films can be made by thermally oxidizing Y—Ba—Cu alloy films (see generally, Hase et al., "Method of manufacturing an oxide superconducting film," U.S. Pat. No. 5,350,738, Sep. 27, 1994). The present inventors have also disclosed how to employ "low temperature oxidation" and short thermal treatments in an inert ambient at 700 C in order to form a range of perovskite oxide films from parent alloy films (see generally, J. M. Eldridge, "Low Cost Processes for Producing High Quality Perovskite Dielectric Films," application Ser. No. 09/945,137). The dielectric constants of crystallized, perovskite oxides can be very large, with values in the 100 to 1000 or more range. The basic process is more complicated than that needed to oxidize layered films of transition metals. (See Example III.) The TM layers would typically be pure metals although they could be alloyed. The TMs are similar metallurgically as are their oxides. In contrast, the parent alloy films that can be converted to a perovskite oxide are typically comprised of metals having widely different chemical reactivities with oxygen and other common gasses. In the Y—Ba—Cu system referenced above, Y and Ba are among the most reactive of metals while the reactivity of Cu approaches (albeit distantly) those of other noble metals. If the alloy is to be completely oxidized, then thin film barriers such as Pd, Pt, etc. or their conductive oxides must be added between the Si and the parent metal film to serve as: electrical contact layers; diffusion barriers; and, oxidation stops. In such a case, the Schottky barrier heights of various TM oxides and perovskite oxides in contact with various metals will help in the design of the tunnel device. In the more likely event that the perovskite parent alloy film will be only partially converted to oxide and then covered with a second layer of the parent alloy (recall the structure of FIG. 2), then the barrier heights will represent that developed during oxide growth at the parent perovskite alloy/perovskite oxide interface. Obviously, such barrier heights cannot be predicted ab initio for such a wide class of materials but will have to be developed as the need arises. This information will have to be developed on a system-by-system basis.

Methods of Operation

Write Operation

Write can be achieved by the normal channel hot electron injection and gate current through the silicon oxide to the floating gate. This is done by selecting a particular column by applying a high control gate voltage and applying relatively large drain voltage as is done with conventional ETOX flash memory devices. However, according to the teachings of the present invention, write can also be accomplished by applying a positive voltage to the substrate or well select line and a large negative voltage to the control gates, electrons will tunnel from the control gate to the floating gate. The low tunnel barrier will provide an easy write operation and the selection of the substrate or well bias will provide selectivity and address only one device.

Erase Operation

According to the teachings of the present invention, erase is achieved by providing a negative voltage to the substrate or well address line and a large positive voltage to the control gate. This causes electrons to tunnel off of the floating gate on to the control gate. A whole row can be erased by addressing all the column lines along that row and a block can be erased by addressing multiple row back gate or substrate/well address lines.

Read Operation

Read is accomplished as in conventional ETOX flash memory devices. A column line is addressed by applying a positive control gate voltage and sensing the current along the data bit or drain row address line.

System Level

Figure 8:
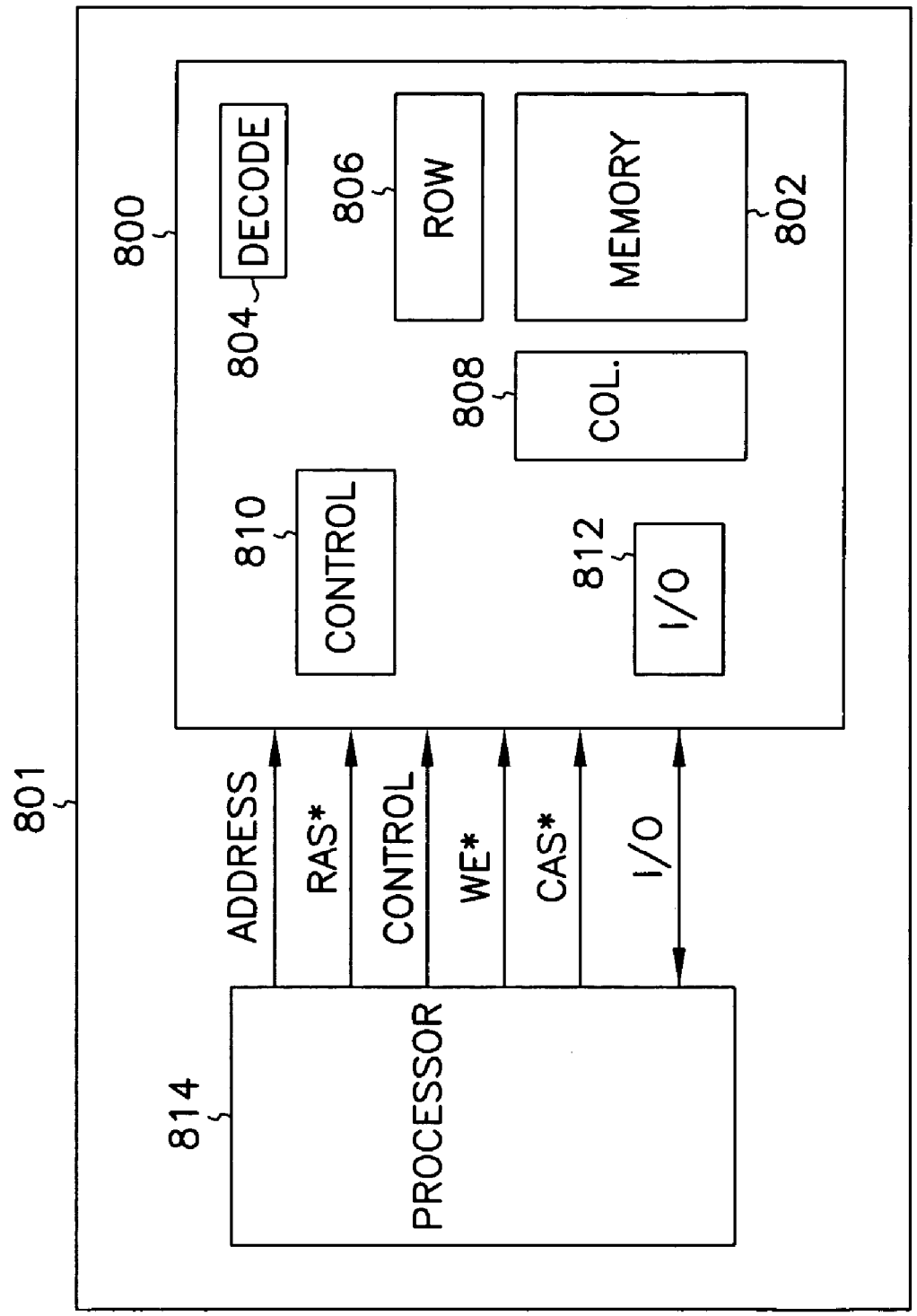
FIG. 8 illustrates a block diagram of an embodiment of an electronic system 801 according to the teachings of the present invention.

FIG. 8 illustrates a block diagram of an embodiment of an electronic system 801 according to the teachings of the present invention. In the embodiment shown in FIG. 8, the system 801 includes a memory device 800 which has an array of memory cells 802, address decoder 804, row access circuitry 806, column access circuitry 808, control circuitry 810, and input/output circuit 812. Also, as shown in FIG. 8, the circuit 801 includes a processor 814, or memory controller for memory accessing. The memory device 800 receives control signals from the processor 814, such as WE*, RAS* and CAS* signals over wiring or metallization lines. The memory device 800 is used to store data which is accessed via I/O lines. It will be appreciated by those skilled in the art that additional circuitry and control signals can be provided, and that the memory device 800 has been simplified to help focus on the invention. At least one of the memory cells 802 has a memory cell formed according to the embodiments of the present invention. That is, at least one memory cell includes a low tunnel barrier interpoly insulator according to the teachings of the present invention.

It will be understood that the embodiment shown in FIG. 8 illustrates an embodiment for electronic system circuitry in which the novel memory cells of the present invention are used. The illustration of system 801, as shown in FIG. 8, is intended to provide a general understanding of one application for the structure and circuitry of the present invention, and is not intended to serve as a complete description of all the elements and features of an electronic system using the novel memory cell structures. Further, the invention is equally applicable to any size and type of memory device 801 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

The above structures and fabrication methods have been described, by way of example, and not by way of limitation, with respect to flash memory with low tunnel barrier interpoly insulators ultra thin body transistors.

It has been shown that the low tunnel barrier interpoly insulators of the present invention avoid the large barriers to electron tunneling or hot electron injection presented by the silicon oxide-silicon interface, 3.2 eV, which result in slow write and erase speeds even at very high electric fields. The present invention also avoids the combination of very high electric fields and damage by hot electron collisions in the which oxide result in a number of operational problems like soft erase error, reliability problems of premature oxide breakdown and a limited number of cycles of write and erase. Further, the low tunnel barrier interploy dielectric insulator erase approach, of the present invention remedies the above mentioned problems of having a rough top surface on the polysilicon floating gate which results in, poor quality interpoly oxides, sharp points, localized high electric fields, premature breakdown and reliability problems.

What is claimed is:

1. A flash memory array, comprising:
   a number of n-channel depletion mode, non-volatile memory cells, wherein each non-volatile memory cell includes:
      a first source/drain region and a second source/drain region separated by a n-channel region;
      a floating gate opposing the n-channel region and separated therefrom by a gate oxide;
      a control gate opposing the floating gate; and
      wherein the control gate is separated from the floating gate by a low tunnel barrier intergate insulator;
   a number of sourcelines coupled to the first source/drain regions along a first selected direction in the flash memory array;
   a number of control gate lines coupled to the control gates along a second selected direction in the flash memory array; and
   a number of bitlines coupled to the second source/drain regions along a third selected direction in the flash memory array.

2. The flash memory array of claim 1, wherein the low tunnel barrier intergate insulator includes a metal oxide insulator selected from the group consisting of PbO, $Al_2O_3$, $Ta_2O_5$, $TiO_2$, $ZrO_2$, and $Nb_2O_5$.

3. The flash memory array of claim 1, wherein the floating gate includes a polysilicon floating gate having a metal layer formed thereon in contact with the low tunnel barrier intergate insulator.

4. The flash memory array of claim 1, wherein the control gate includes a polysilicon control gate having a metal layer formed thereon in contact with the low tunnel barrier intergate insulator.

5. The flash memory array of claim 1, wherein the second selected direction and the third selected direction are parallel to one another and orthogonal to the first selected direction, and wherein the number of control gate lines serve as address lines.

6. The flash memory array of claim 1, wherein the first selected direction and the third selected direction are parallel to one another and orthogonal to the second selected direction, and wherein the number of control gate lines serve as address lines.

7. The flash memory array of claim 1, wherein the first selected direction and the second selected direction are parallel to one another and orthogonal to the third selected direction, and wherein the number of bitlines serve as address lines.

8. An array of flash memory cells, comprising:
a number of pillars extending outwardly from a substrate, wherein each pillar includes a first source/drain region, a body region having an n-type channel, and a second source/drain region;
a number of floating gates opposing the body regions in the number of pillars and separated therefrom by a gate oxide;
a number of control gates opposing the floating gates;
a number of buried sourcelines disposed below the number of pillars and coupled to the first source/drain regions along a first selected direction in the array of memory cells;
a number of control gate lines formed integrally with the number of control gates along a second selected direction in the array of flash memory cells, wherein the number of control gates are separated from the floating gates by a low tunnel barrier intergate insulator; and
a number of bitlines coupled to the second source/drain regions along a third selected direction in the array of flash cells.

9. The array of flash memory cells of claim 8, wherein the low tunnel barrier intergate insulator includes a metal oxide insulator selected from the group consisting of PbO, $Al_2O_3$, $Ta_2O_5$, $TiO_2$, $ZrO_2$, and $Nb_2O_5$.

10. The array of flash memory cells of claim 8, wherein each floating gate includes a polysilicon floating gate having a metal layer formed thereon in contact with the low tunnel barrier intergate insulator.

11. The array of flash memory cells of claim 8, wherein each control gate includes a polysilicon control gate having a metal layer formed thereon in contact with the low tunnel barrier intergate insulator.

12. The array of flash memory cells of claim 8, wherein each floating gate is a vertical floating gate formed in a trench below a top surface of each pillar such that each trench houses a pair of floating gates opposing the body regions in adjacent pillars on opposing sides of the trench.

13. The array of flash memory cells of claim 12, wherein the plurality of control gate lines are formed in the trench below the top surface of the pillar and between the pair of floating gates, wherein each pair of floating gates shares a single control gate line, and wherein each floating gate includes a vertically oriented floating gate having a vertical length of less than 100 nanometers.

14. The array of flash memory cells of claim 12, wherein the plurality of control gate lines are formed in the trench below the top surface of the pillar and between the pair of floating gates such that each trench houses a pair of control gate lines each addressing the floating gates one on opposing sides of the trench respectively, and wherein the pair of control gate lines are separated by an insulator layer.

15. The array of flash memory cells of claim 12, wherein the plurality of control gate lines are disposed vertically above the floating gates, and wherein each pair of floating gates shares a single control gate line.

16. The array of flash memory cells of claim 12, wherein the plurality of control gate lines are disposed vertically above the floating gates, and wherein each one of the pair of floating gates is addressed by an independent one of the plurality of control gate lines.

17. The array of flash memory cells of claim 8, wherein each floating gate is a horizontally oriented floating gate formed in a trench below a top surface of each pillar such that each trench houses a floating gate opposing the body regions in adjacent pillars on opposing sides of the trench, and wherein each horizontally oriented floating gate has a vertical length of less than 100 nanometers opposing the body region of the pillars.

18. The array of flash memory cells of claim 17, wherein the plurality of control gate lines are disposed vertically above the floating gates.

19. An electronic system, comprising:
a processor; and
a memory device coupled to the processor, wherein the memory device includes an array of n-channel depletion mode flash memory cells, comprising:
a number of pillars extending outwardly from a substrate, wherein each pillar includes a first source/drain region, a body region having a n-type depletion mode channel region, and a second source/drain region;
a number of floating gates opposing the body regions in the number of pillars and separated therefrom by a gate oxide;
a number of control gates opposing the floating gates;
a number of buried sourcelines disposed below the number of pillars and coupled to the first source/drain regions along a first selected direction in the array of memory cells;
a number of control gate lines formed integrally with the number of control gates along a second selected direction in the array of flash memory cells, wherein the number of control gates are separated from the floating gates by a low tunnel barrier intergate insulator; and
a number of bitlines coupled to the second source/drain regions along a third selected direction in the array of flash cells.

20. The electronic system of claim 19, wherein the low tunnel barrier intergate insulator includes a metal oxide insulator selected from the group consisting of $Al_2O_3$, $Ta_2O_5$, $TiO_2$, $ZrO_2$, and $Nb_2O_5$.

21. The electronic system of claim 19, wherein each floating gate includes a polysilicon floating gate having a metal layer formed thereon in contact with the low tunnel barrier intergate insulator.

22. The electronic system of claim 19, wherein each control gate includes a polysilicon control gate having a metal layer formed thereon in contact with the low tunnel barrier intergate insulator.

23. The electronic system of claim 19, wherein each floating gate is a vertical floating gate formed in a trench below a top surface of each pillar such that each trench houses a pair of floating gates opposing the body regions in adjacent pillars on opposing sides of the trench.

24. The electronic system of claim 23, wherein the plurality of control gate lines are formed in the trench below the top surface of the pillar and between the pair of floating gates, wherein each pair of floating gates shares a single control gate line, and wherein each floating gate includes a vertically oriented floating gate having a vertical length of less than 100 nanometers.

25. The electronic system of claim 23, wherein the plurality of control gate lines are formed in the trench below the top surface of the pillar and between the pair of floating gates such that each trench houses a pair of control gate lines each addressing the floating gates one on opposing sides of the trench respectively, and wherein the pair of control gate lines are separated by an insulator layer.

26. The electronic system of claim 23, wherein the plurality of control gate lines are disposed vertically above the floating gates, and wherein each pair of floating gates shares a single control gate line.

27. The electronic system of claim 23, wherein the plurality of control gate lines are disposed vertically above the floating gates, and wherein each one of the pair of floating gates is addressed by an independent one of the plurality of control lines.

28. The electronic system of claim 19, wherein each floating gate is a horizontally oriented floating gate formed in a trench below a top surface of each pillar such that each trench houses a floating gate opposing the body regions in adjacent pillars on opposing sides of the trench, and wherein each horizontally oriented floating gate has a vertical length of less than 100 nanometers opposing the body region of the pillars.

29. The electronic system of claim 28, wherein the plurality of control gate lines are disposed vertically above the floating gates.

30. The flash memory array of claim 1, wherein the low tunnel barrier intergate insulator includes aluminum.

31. The flash memory array of claim 1, wherein the low tunnel barrier intergate insulator includes tantalum.

32. The array of flash memory cells of claim 12, wherein the low tunnel barrier intergate insulator includes titanium.

33. The array of flash memory cells of claim 12, wherein the low tunnel barrier intergate insulator includes aluminum.

34. The array of flash memory cells of claim 8, wherein the low tunnel barrier intergate insulator includes at least of a group consisting of titanium, aluminum, tantalum, and zirconium.

35. The electronic system of claim 19, wherein the low tunnel barrier intergate insulator includes titanium.

36. The electronic system of claim 19, wherein the low tunnel barrier intergate insulator includes aluminum.

37. The electronic system of claim 19, wherein the low tunnel barrier intergate insulator includes lead.

38. The electronic system of claim 19, wherein the low tunnel barrier intergate insulator includes a transition metal oxide.

* * * * *

UNITED STATES PATENT AND TRADEMARK OFFICE
CERTIFICATE OF CORRECTION

| | |
|---|---|
| PATENT NO. | : 7,545,674 B2 |
| APPLICATION NO. | : 10/931704 |
| DATED | : June 9, 2009 |
| INVENTOR(S) | : Leonard Forbes et al. |

It is certified that error appears in the above-identified patent and that said Letters Patent is hereby corrected as shown below:

In column 20, line 35, in Claim 20, after "consisting of" insert -- PbO, --.

Signed and Sealed this

Twenty-eighth Day of July, 2009

JOHN DOLL
*Acting Director of the United States Patent and Trademark Office*